(12) United States Patent
Inoue

(10) Patent No.: US 10,877,692 B2
(45) Date of Patent: Dec. 29, 2020

(54) MEMORY SYSTEM

(71) Applicant: TOSHIBA MEMORY CORPORATION, Tokyo (JP)

(72) Inventor: Koichi Inoue, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 76 days.

(21) Appl. No.: 15/952,613

(22) Filed: Apr. 13, 2018

(65) Prior Publication Data

US 2019/0065114 A1  Feb. 28, 2019

(30) Foreign Application Priority Data

Aug. 25, 2017  (JP) ................. 2017-162728

(51) Int. Cl.

| | |
|---|---|
| G06F 3/06 | (2006.01) |
| G06F 11/10 | (2006.01) |
| G11C 29/52 | (2006.01) |
| G06F 12/10 | (2016.01) |
| G06F 13/16 | (2006.01) |
| G11C 29/50 | (2006.01) |
| G11C 7/22 | (2006.01) |

(Continued)

(52) U.S. Cl.
CPC ............ *G06F 3/0659* (2013.01); *G06F 3/061* (2013.01); *G06F 3/0611* (2013.01); *G06F 3/0635* (2013.01); *G06F 3/0653* (2013.01); *G06F 3/0679* (2013.01); *G06F 3/0688* (2013.01); *G06F 11/1048* (2013.01); *G06F 11/1068* (2013.01); *G06F 12/10* (2013.01); *G06F 13/1684* (2013.01); *G11C 7/22* (2013.01); *G11C 29/50012* (2013.01); *G11C 29/52* (2013.01); *G06F 2212/1041* (2013.01); *G06F 2212/7201* (2013.01); *G11C 29/44* (2013.01); *G11C 2029/0411* (2013.01)

(58) Field of Classification Search
CPC .. G06F 3/0659; G06F 11/1048; G06F 3/0688; G06F 3/0635; G06F 3/061; G06F 13/1684; G06F 11/1068; G06F 3/0611; G06F 3/0679; G06F 3/0653; G06F 12/10; G06F 2212/1041; G06F 2212/7201; G11C 29/50012; G11C 7/22; G11C 29/52; G11C 2029/0411; G11C 29/44
USPC ........................................... 714/764
See application file for complete search history.

(56) References Cited

U.S. PATENT DOCUMENTS

| | | | |
|---|---|---|---|
| 5,978,941 A | 11/1999 | Katayama et al. | |
| 8,982,619 B2 * | 3/2015 | Strasser | .............. G06F 12/0246 365/185.03 |
| 9,058,884 B2 | 6/2015 | Ueda | |

(Continued)

*Primary Examiner* — James C Kerveros
(74) *Attorney, Agent, or Firm* — Foley & Lardner LLP

(57) ABSTRACT

A memory system includes a plurality of first memory chips connected to a first bus, a plurality of second memory chips connected to a second bus, and a controller that is connected to the first and second buses and configured to execute a write operation by performing processes that include selecting one of the plurality of first memory chips based on first information including data reading speed information and/or data writing speed information for the plurality of first memory chips, and selecting one of the plurality of second memory chips based on second information including data reading speed information and/or data writing speed information for the plurality of second memory chips.

18 Claims, 19 Drawing Sheets

(51) Int. Cl.
*G11C 29/44* (2006.01)
*G11C 29/04* (2006.01)

(56) References Cited

U.S. PATENT DOCUMENTS

| | | | |
|---|---|---|---|
| 9,431,054 B1* | 8/2016 | Goker | G06F 11/1076 |
| 10,114,555 B2* | 10/2018 | Chang | G06F 3/061 |
| 2002/0138610 A1* | 9/2002 | Miyazawa | H04L 29/06 |
| | | | 709/224 |
| 2005/0041453 A1* | 2/2005 | Brazis | G11C 7/1006 |
| | | | 365/63 |
| 2008/0117682 A1* | 5/2008 | Byeon | G06F 13/1684 |
| | | | 365/185.18 |
| 2012/0117303 A1* | 5/2012 | Carannante | G06F 12/0246 |
| | | | 711/103 |
| 2015/0378820 A1* | 12/2015 | Doerner | G06F 11/1076 |
| | | | 714/766 |
| 2016/0011939 A1* | 1/2016 | Luby | G06F 11/1076 |
| | | | 714/764 |
| 2016/0291870 A1* | 10/2016 | Debrosse | G11C 11/1675 |
| 2018/0336958 A1* | 11/2018 | Kim | G11C 29/022 |
| 2019/0121695 A1* | 4/2019 | Son | G06F 11/1008 |
| 2019/0379400 A1* | 12/2019 | Eda | G06F 11/1076 |

* cited by examiner

US 10,877,692 B2

MEMORY SYSTEM

CROSS-REFERENCE TO RELATED APPLICATION

This application is based on and claims priority to Japanese Patent Application No. 2017-162728, filed Aug. 25, 2017, the entire contents of which are incorporated herein by reference.

FIELD

Embodiments described herein relate generally to a memory system.

BACKGROUND

A memory system can include a solid state drive (SSD) on which a non-volatile semiconductor memory such as a NAND flash memory is mounted.

DETAILED DESCRIPTION

One or more embodiments provide a memory system of which the processing capability is improved.

In general, according to one or more embodiments, a memory system includes: a plurality of first memory chips connected to a first bus; a plurality of second memory chips connected to a second bus; and a controller that is connected to the first and second buses and configured to execute a write operation by performing operations that include: selecting one or more first memory chips of the plurality of first memory chips based on first information including data reading speed information and/or data writing speed information for the plurality of first memory chips, and selecting one or more second memory chips of the plurality of second memory chips based on second information including data reading speed information and/or data writing speed information for the plurality of second memory chips.

Hereinafter, embodiments will be described with reference to the drawings. The drawings are schematic. In description presented below, a same reference sign will be assigned to constituent elements or components having substantially a same or similar function and substantially a same or similar configuration. Reference signs having same letters but terminated by different numbers may refer to elements or components having similar configurations. In a case where elements denoted by reference signs including the same letters do not need to be distinguished from each other for purposes of the present disclosure, such elements will be referred to using a reference sign including only the same letters.

1. FIRST ASPECT

Hereinafter, one or more embodiments of a memory system according to a first aspect will be described. In description presented below, a case in which the memory system is a solid state drive (SSD) will be described as an example.

1.1 Configuration 1.1.1 Configuration of Memory System

First, a configuration of a memory system 1 will be described with reference to FIG. 1.

Figure 1:
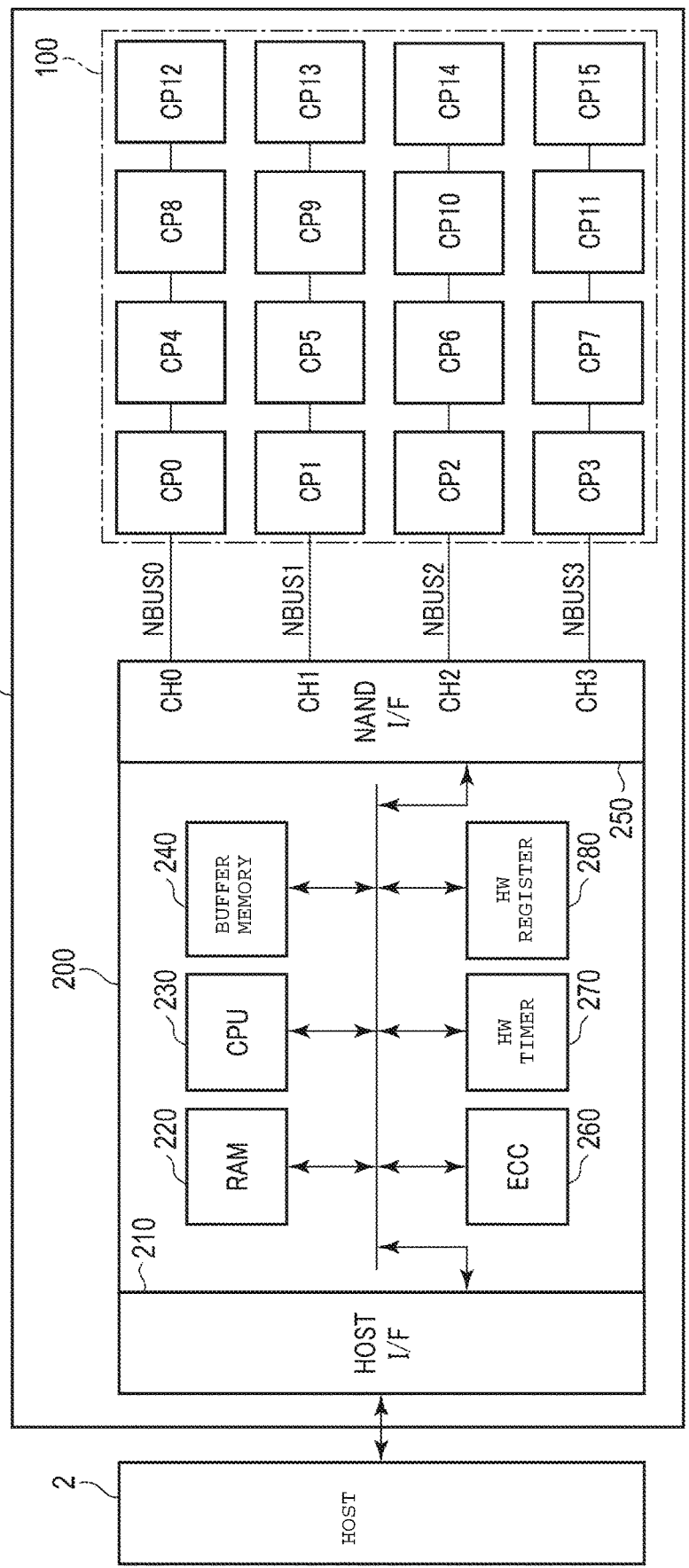
FIG. 1 is a block diagram of a memory system according to one or more embodiments.

As illustrated in FIG. 1, the memory system 1 includes a storage medium 100 and a controller 200.

The storage medium 100 includes a plurality of chips. According to this aspect, a case will be described in which a chip is a three-dimensionally stacked NAND flash memory. Hereinafter, a chip will be referred to as a "NAND chip CP". In the example illustrated in FIG. 1, the storage medium 100 includes sixteen (16) NAND chips CP0 to CP15. Here, any number of NAND chips may be provided in the storage medium 100. The NAND chip CP is connected to a controller 200 through a bus NBUS. More specifically, the NAND chips CP0, CP4, CP8, and CP12 are connected to a channel CH0 of the controller 200 through a bus NBUS0. Similarly, the NAND chips CP1, CP5, CP9, and CP13 are connected to a channel CH1 of the controller 200 through a bus NBUS1, the NAND chips CP2, CP6, CP10, and CP14 are connected to a channel CH2 of the controller 200 through a bus NBUS2, and the NAND chips CP3, CP7, CP11, and CP15 are connected to a channel CH3 of the controller 200 through a bus NBUS3. Any number of buses NBUS may be provided. Any number of NAND chips CP may be connected to one bus NBUS.

The controller 200 receives a command from a host apparatus 2 and controls the storage medium 100 based on the received command. Specifically, in a case where a write command is received from the host apparatus 2, the controller 200 writes data into the storage medium 100. On the other hand, in a case where a read command is received from the host apparatus 2, the controller 200 reads data from the storage medium 100 and transmits the read data to the host apparatus 2. In addition, the controller 200 manages the memory space of the storage medium 100.

The controller 200 includes: a host interface circuit 210; a built-in memory (RAM) 220; a processor (CPU) 230; a buffer memory 240; a NAND interface circuit 250; an ECC circuit 260; a HW timer 270; and a HW register 280. The controller 200, for example, may be a system on a chip (SoC).

The host interface circuit 210 is connected to the host apparatus 2 through a controller bus and is responsible for communication with the host apparatus 2. Examples of the controller bus between the host interface circuit 210 and the host apparatus 2 include a serial advanced technology attachment (SATA), a serial attached small computer system interface (SAS), and a peripheral component interconnect (PCI) Express™, and may be any other bus. The host interface circuit 210 transfers a command and data received from the host apparatus 2 to the processor 230 and the buffer memory 240. In addition, the host interface circuit 210 transfers data stored in the buffer memory 240 to the host apparatus 2 in response to a command from the processor 230.

The NAND interface circuit 250 is connected to the storage medium 100 through the bus NBUS and is responsible for communication with the storage medium 100. In the example illustrated in FIG. 1, the NAND interface circuit 250 includes the four channels CH0 to CH3. The buses NBUS0 to NBUS3 are respectively connected to the channels CH0 to CH3. At the time of writing, the NAND interface circuit 250 transfers write data stored in the buffer memory 240 to the storage medium 100. On the other hand, at the time of reading, the NAND interface circuit 250 transfers data read from the storage medium 100 to the buffer memory 240.

The processor (CPU) 230 controls the overall operation of the controller 200. In addition, the processor 230 issues various commands in accordance with a command from the host apparatus 2 and transmits the issued commands to a corresponding NAND chip CP of the storage medium 100. For example, when a write command is received from the host apparatus 2, the processor 230 transmits a write command to a corresponding NAND chip CP of the storage medium 100 in response thereto. A similar operation can be implemented at the time of reading and at the time of erasing. In addition, the processor 230 executes various processes used for managing the storage medium 100, such as wear levelling. Furthermore, the processor 230 executes various arithmetic operations. For example, the processor 230 executes an encryption process, a randomizing process.

In addition, the processor 230 converts a logical address received from the host apparatus 2 to a physical address of the storage medium 100 corresponding to the logical address. The logical address is associated with data requested to be accessed (read, write, erase, or the like) from the host apparatus 2. The physical address specifies a certain part of the memory space of the storage medium 100.

For example, when a read command is received from the host apparatus 2, the processor 230 reads data indicating a physical address corresponding to a target logical address (hereinafter, referred to as a "logical/physical conversion data") into the RAM 220, from a table stored in the storage medium 100 in which a logical address and a physical address are associated with each other (hereinafter, referred to as a "lookup table LUT"). Then, after converting the logical address into the physical address by using the logical/physical conversion data stored in the RAM 220, the processor 230 transmits a read command to a corresponding NAND chip CP of the storage medium 100. In a case where a write command is received from the host apparatus 2, the processor 230 assigns, identifies, or determines a physical address corresponding to a logical address and transmits a write command to a corresponding NAND chip CP of the storage medium 100. Then, the processor 230 transmits newly-assigned logical/physical conversion data held in the RAM 220 to the storage medium 100 to update the lookup table LUT.

The built-in memory (RAM) 220, for example, is a semiconductor memory such as a dynamic RAM (DRAM) and is used as a work area of the processor 230. The built-in memory 220 holds firmware, various management tables, and the like used for managing the storage medium 100. In addition, the RAM 220 temporarily holds the logical/physical conversion data read from the lookup table LUT or newly-generated logical/physical conversion data.

The buffer memory 240 may also hold data such as data to be written into the storage medium 100 (write data), and data read from the storage medium 100 (read data). The buffer memory 240, for example, includes a DRAM and a controller of the DRAM, and/or a static RAM (SRAM).

The ECC circuit 260 executes an error checking and correcting (ECC) process of data. The ECC circuit 260 may count the number of error bits and transmit a rate of erroneous bits (hereinafter, referred to as a "bit error rate" (BER)") to the HW register 280.

The HW timer 270 measures a read operation period of data and/or a write operation period of data in each NAND chip CP. Hereinafter, a result of the measurement of the read operation period will be referred to as a "reading speed" and a result of the measurement of the write operation period will be referred to as a "writing speed". More specifically, at the time of executing a read operation and/or a write operation, a period in which a ready/busy signal R/Bn transmitted from the NAND chip CP represents a busy state is measured, and a result of the measurement is transmitted to the HW register 280. The ready/busy signal R/Bn will be described later.

In the HW register 280, a table associating each NAND chip CP and reading speed information and/or writing speed information is stored. In the HW register 280, a table associating each NAND chip CP and a bit error rate BER may be stored.

1.1.2 Configuration of NAND Chip

Figure 2:
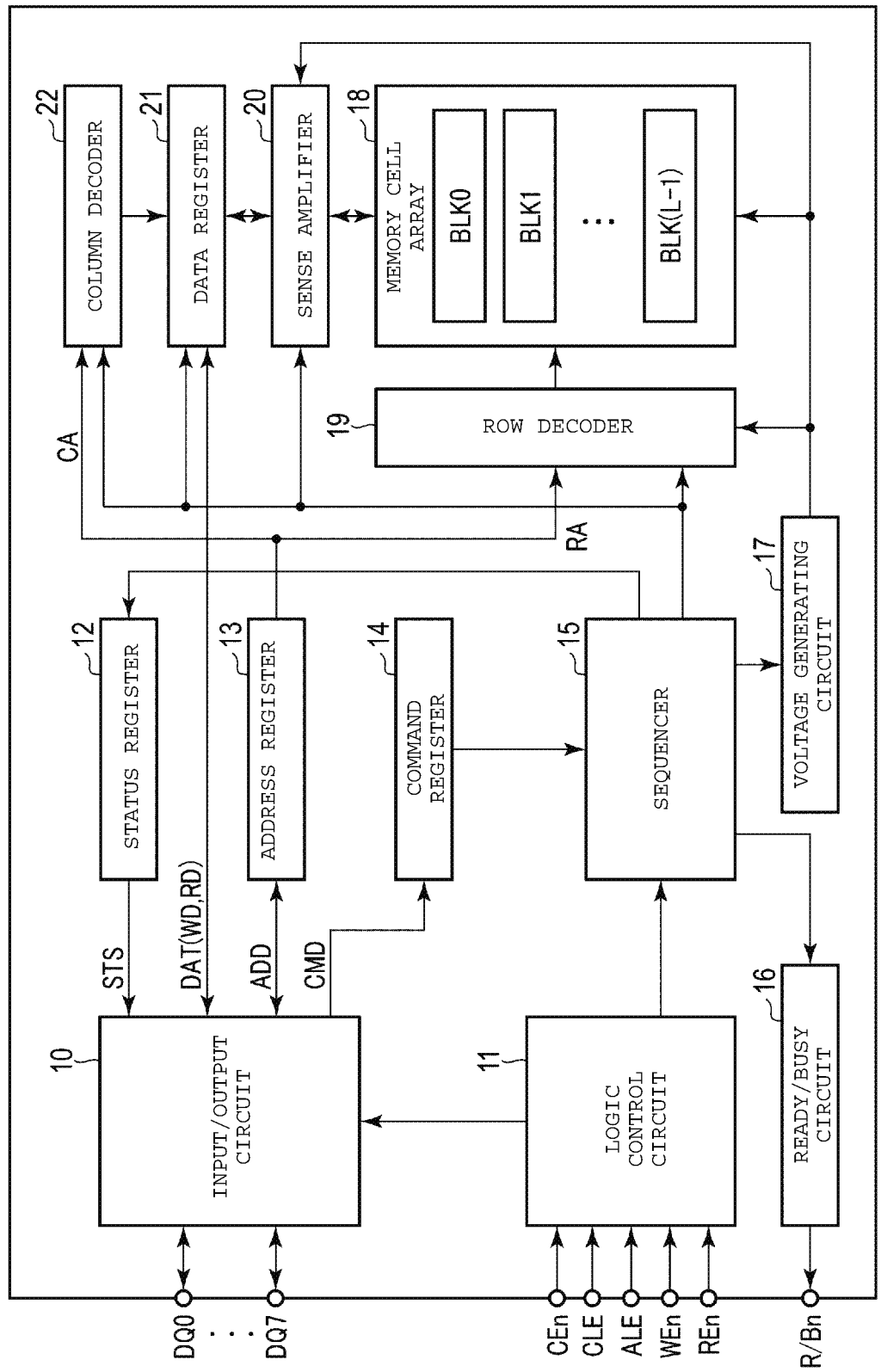
FIG. 2 is a block diagram of a NAND chip provided in the memory system according to one or more embodiments.

Next, the configuration of the NAND chip CP will be described with reference to FIG. 2. FIG. 2 shows connections between blocks by arrow lines. It should be noted that the connection between the blocks is not limited to the depicted connections.

As illustrated in FIG. 2, the NAND chip CP is connected to the controller 200 by using the bus NBUS and operates based on a command from the controller 200. More specifically, the NAND chip CP, for example, executes transmission/reception of 8-bit signals DQ0 to DQ7 to/from the controller 200. The signals DQ0 to DQ7 include, for example, data, an address, and a command. In addition, the NAND chip CP, for example, receives a chip enable signal CEn, a command latch enable signal CLE, an address latch enable signal ALE, a write enable signal WEn, and a read enable signal REn from the controller 200. The NAND chip CP transmits the ready/busy signal R/Bn to the controller 200.

The chip enable signal CEn is a signal used for enabling the NAND chip CP and, for example, is asserted in a low ("L") level. The command latch enable signal CLE is a signal representing that a signal DQ is a command and, for example, is asserted in a high ("H") level. The address latch enable signal ALE is a signal representing that a signal DQ is an address and, for example, is asserted in the "H" level. The write enable signal WEn is a signal used for the NAND chip CP to obtain a received signal in it and, for example, is asserted in the "L" level when a command, an address, data, or the like is received from the controller 200. Accordingly, when the write enable signal WEn is toggled, the signal DQ is taken into (e.g. transmitted to or applied to) the NAND chip CP. The read enable signal REn is a signal used for causing the controller 200 to read data from the NAND chip CP. The read enable signal REn, for example, is asserted in the "L" level. The ready/busy signal R/Bn is a signal representing whether the NAND chip CP is in a busy state or a ready state (e.g., a state in which a command cannot be received from the controller 200 or a state in which a command can be received) and, for example, is in the "L" level when the NAND chip CP is in the busy state.

The NAND chip CP includes an input/output circuit 10, a logic control circuit 11, a status register 12, an address register 13, a command register 14, a sequencer 15, a ready/busy circuit 16, a voltage generating circuit 17, a memory cell array 18, a row decoder 19, a sense amplifier 20, a data register 21, and a column decoder 22.

The input/output circuit 10 controls the input/output of the signal DQ from/to the controller 200. More specifically, the input/output circuit 10 includes an input circuit and an output circuit. The input circuit transmits data DAT (write data WD) received from the controller 200 to the data register 21, transmits an address ADD to the address register 13, and transmits a command CMD to the command register 14. The output circuit transmits status information STS received from the status register 12, the data DAT (read data RD) received from the data register 21, and the address ADD received from the address register 13 to the controller 200.

The logic control circuit 11, for example, receives the chip enable signal CEn, the command latch enable signal CLE, the address latch enable signal ALE, the write enable signal WEn, and the read enable signal REn from the controller 200. Then, the logic control circuit 11 controls the input/output circuit 10 and the sequencer 15 in accordance with the received signals.

The status register 12, for example, temporarily holds status information STS in a writing, reading, or erasing operation of data and notifies the controller 200 of whether or not the operation is normally ended (e.g. desirably ended or ended according to a protocol or policy).

The address register 13 temporarily stores an address ADD received from the controller 200 through the input/output circuit 10. Then, the address register 13 transfers a row address RA to the row decoder 19 and transfers a column address CA to the column decoder 22.

The command register 14 temporarily stores the command CMD received from the controller 200 through the input/output circuit 10 and transfers the command to the sequencer 15.

The sequencer 15 controls the overall operation of the NAND chip CP. More specifically, the sequencer 15, for example, controls the status register 12, the ready/busy circuit 16, the voltage generating circuit 17, the row decoder 19, the sense amplifier 20, the data register 21, the column decoder 22, and the like in accordance with the command CMD stored in the command register 14, thereby executing a write operation, a read operation, an erasing operation, and the like.

The ready/busy circuit 16 transmits the ready/busy signal R/Bn to the controller 200 in accordance with the operation status of the sequencer 15.

The voltage generating circuit 17 generates voltages used for a write operation, a read operation, and an erasing operation in accordance with the control of the sequencer 15 and supplies the generated voltages, for example, to the memory cell array 18, the row decoder 19, the sense amplifier 20. The row decoder 19 and the sense amplifier 20 apply the voltages supplied from the voltage generating circuit 17 to memory cell transistors disposed in the memory cell array 18.

The memory cell array 18 includes a plurality of blocks BLK (BLK0, BLK1, . . . , BL (L-1)) (here, L is an integer of two or more) including non-volatile memory cell transistors (hereinafter, also referred to as "memory cells") associated with a row and a column. Each of the blocks BLK includes a plurality of string units SU (SU0, SU1, SU2, SU3, . . . ). Each of the string units SU includes a plurality of NAND strings SR. Here, any number of blocks BLK may be included in the memory cell array 18 and any number of string units SU may be included in each block BLK. Details of the memory cell array 18 will be described later.

The row decoder 19 decodes the row address RA. The row decoder 19, based on a result of the decoding, selects one of the blocks BLK and further selects one string unit SU. Then, the row decoder 19 applies an appropriate voltage to the block BLK.

At the time of executing a read operation, the sense amplifier 20 senses data read from the memory cell array 18. Then, the sense amplifier 20 transmits the read data RD to the data register 21. In addition, at the time of executing a write operation, the sense amplifier 20 transmits the write data WD to the memory cell array 18.

The data register 21 includes a plurality of latch circuits. A latch circuit holds the write data WD and the read data RD. For example, in a write operation, the data register 21 temporarily holds the write data WD received from the input/output circuit 10 and transmits the write data WD to the sense amplifier 20. In addition, for example, in a read operation, the data register 21 temporarily holds the read data RD received from the sense amplifier 20 and transmits the read data RD to the input/output circuit 10.

The column decoder 22, for example, at the time of executing a write operation, a read operation, or an erasing operation, decodes the column address CA and selects a latch circuit disposed in the data register 21 in accordance with a result of the decoding.

1.1.3 Configuration of Memory Cell Array

Next, the configuration of the memory cell array 18 will be described with reference to FIG. 3. While the example illustrated in FIG. 3 illustrates the block BLK0, the configurations of any other blocks BLK are the same.

Figure 3:
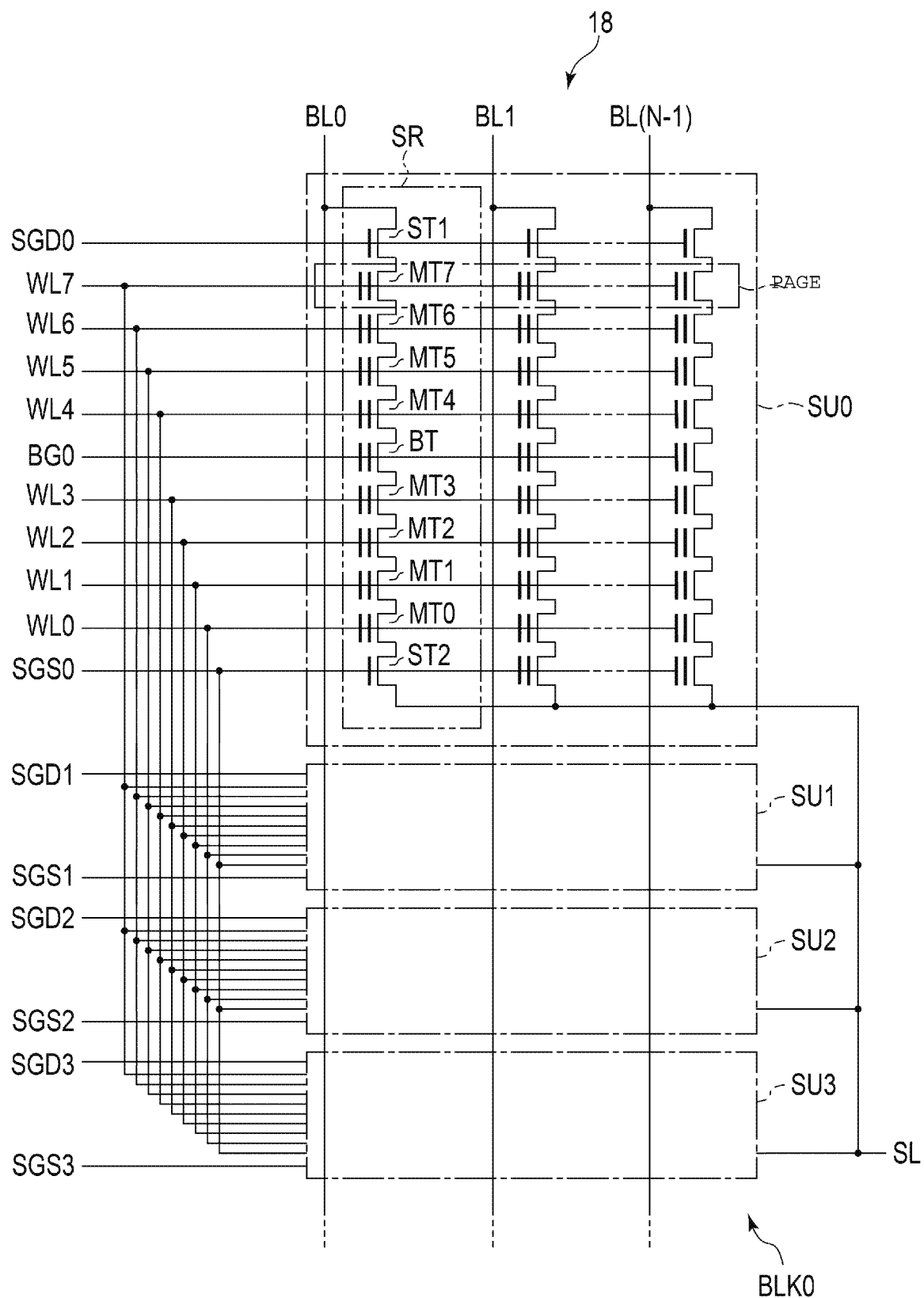
FIG. 3 is a circuit diagram of a memory cell array of the NAND chip provided in the memory system according to one or more embodiments.

As illustrated in FIG. 3, the block BLK0, for example, includes the four string units SU (SU0 to SU3). Each string unit SU includes a plurality of the NAND strings SR. Each NAND string SR, for example, includes eight memory cell transistors MT0 to MT7 and select transistors ST1 and ST2. Hereinafter, in a case where any one of the memory cell transistors MT0 to MT7 is not particularly referred to, it will be referred to as a memory cell transistor MT. The memory cell transistor MT includes a control gate and an electric charge accumulating layer and stores data in a non-volatile manner.

The memory cell transistor MT may be a MONOS type in which an insulating film is used in the electric charge accumulating layer or an FG type in which a conductive layer is used in the electric charge accumulating layer. Hereinafter, according to this aspect, the MONOS type will be described as an example. The number of memory cell transistors MT is not limited to eight but may be 16, 32, 64, or 128, for example, and the number is not limited. Furthermore, the number of the select transistors may be one or more.

The memory cell transistors MT are connected in series between the source of the select transistor ST1 and the drain of the select transistor ST2. More specifically, the current paths of the memory cell transistors MT0 to MT7 are connected in series. The drain of the memory cell transistor MT7 is connected to the source of the select transistor ST1, and the source of the memory cell transistor MT0 is connected to the drain of the select transistor ST2.

The gates of the select transistors ST1 of the string units SU0 to SU3 are connected to the row decoder 19 respectively through select gate lines SGD0 to SGD3. Similarly, the gates of the select transistors ST2 of the string units SU0 to SU3 are connected to the row decoder 19 respectively through select gate lines SGS0 to SGS3. Hereinafter, in a case where any one of the select gate lines SGD0 to SGD3 is not particularly referred to, it will be referred to as a select gate line SGD. In a case where any one of the select gate lines SGS0 to SGS3 is not particularly referred to, it will be referred to as a select gate line SGS. In addition, the select gate lines SGS0 to SGS3 of each string units SU may be connected in common.

The control gates of the memory cell transistors MT0 to MT7 disposed in the block BLK are respectively connected to word lines WL0 to WL7 in common. The word lines WL0 to WL7 are connected to the row decoder 19. Hereinafter, in a case where any one of the word lines WL0 to WL7 is not particularly referred to, it will be referred to as a word line WL.

The drains of the select transistors ST1 of the NAND strings SR disposed in the string unit SU are respectively connected to different bit lines BL to BL (N-1) (here, N is an integer of two or more). Hereinafter, in a case where any one of the bit lines BL0 to BL (N-1) is not particularly referred to, it will be referred to as a bit line BL. Each bit line BL is connected to the sense amplifier 20. Each bit line BL connects one NAND string SR disposed in each string unit SU between the plurality of blocks BLK in common. In addition, the sources of the plurality of select transistors ST2 are connected to a source line SL in common. In other words, the string unit SU is a group of the NAND strings SR that are connected to different bit lines BL and are connected to the same select gate lines SGD and SGS. In addition, the block BLK is a group of the plurality of string units SU having the word line WL in common. The memory cell array 18 is a group of the plurality of blocks BLK having the bit line BL in common.

Data writing or data reading is comprehensively executed for the memory cell transistors MT connected to any one of the word lines WL in any one of the string units SU. Hereinafter, a group of memory cell transistors MT selected together when data writing or data reading is executed will be referred to as a "memory cell group MCG". A group of one-bit data of the memory cell transistors MT that are written/read into/from one memory cell group MCG will be referred to as a "page".

1.1.4 Sectional Configuration of Memory Cell Array

Figure 4:
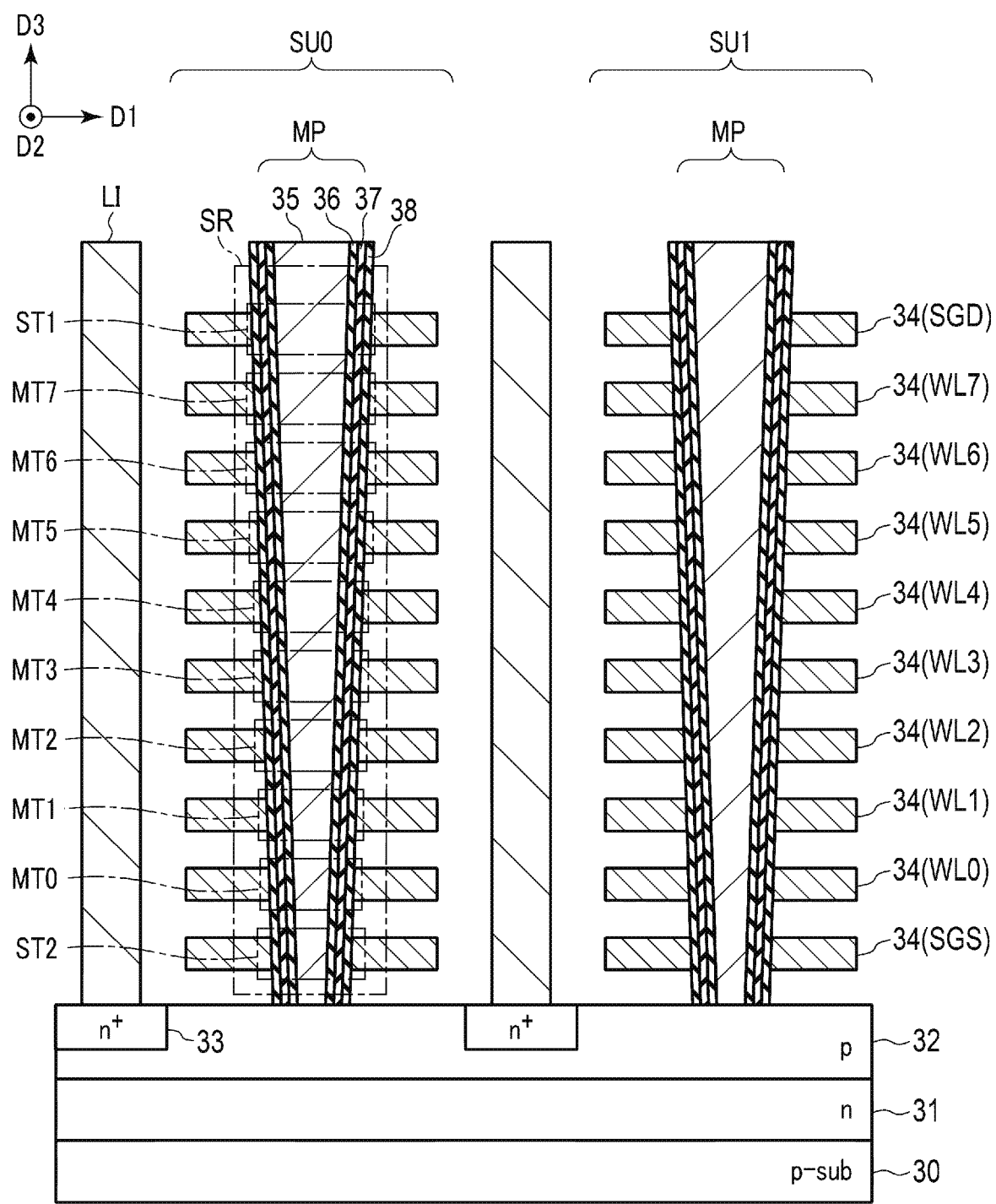
FIG. 4 is a sectional view of the memory cell array of the NAND chip provided in the memory system according to one or more embodiments.

Next, the sectional configuration of the memory cell array 18 will be described with reference to FIG. 4. The example illustrated in FIG. 4 illustrates sections of the string units SU0 and SU1, and the configurations of the string units SU2 and SU3 are similar thereto. In FIG. 4, an interlayer insulating film is not illustrated.

As illustrated in FIG. 4, in a first direction D1 parallel to a semiconductor substrate 30, a plurality of source line contacts LI extending in a second direction D2 that is perpendicular to the first direction D1 parallel to the semiconductor substrate 30 is disposed. One string unit SU is disposed between two source line contacts LI. The source line contact LI connects the semiconductor substrate 30 and a source line SL, which is not illustrated in the drawing, disposed on an upper side than the NAND string SR. Here, the arrangement of the source line contact LI and the NAND string SR may be freely selected. For example, a plurality of string units SU may be disposed between two source line contacts LI. In the example illustrated in FIG. 4, for simplification of description, while a case is illustrated in which the plurality of NAND strings SR is arranged in one column in the second direction D2 in one string unit SU, the arrangement of NAND strings SR in one string unit SU may be freely selected. For example, the NAND strings SR may be arranged in two columns in parallel in the second direction D2 or may be arranged in a staggered manner of four columns.

In each string unit SU, the NAND string SR is formed in a third direction D3 that is perpendicular to the semiconductor substrate 30. More specifically, an n-type well 31 is disposed in a front-face area of the semiconductor substrates 30. A p-type well 32 is disposed on the front-face area of the n-type well 31. In a part of the front-face area of the p-type well 32, an n+ type diffusion layer 33 is disposed. On the upper side of the p-type well 32, wiring layers 34 of ten layers functioning as the select gate line SGS, the word line WL, and the select gate line SGD are sequentially stacked through an interlayer insulating film (not illustrated in the drawing).

A semiconductor layer 35 having a pillar shape penetrating through the wiring layers 34 of ten layers to reach the p-type well 32 is formed. On the side face of the semiconductor layer 35, a tunnel insulating film 36, an electric charge accumulating layer 37, and a block insulating film 38 are sequentially formed. For example, polycrystalline silicon is used for (or, is included in) the semiconductor layer 35. For example, a silicon oxide film is used for (or, is included in) each of the tunnel insulating film 36 and the block insulating film 38. For example, a silicon nitride film is used for (or, is included in) the electric charge accumulating layer 37. Hereinafter, a pillar formed by the semiconductor layer 35, the tunnel insulating film 36, the electric charge accumulating layer 37, and the block insulating film 38 will be referred to as a "memory pillar MP". The semiconductor layer 35 functions as a current path of the NAND string SR and becomes an area in which the channel of each transistor is formed. An upper end of the semiconductor layer 35 is connected to a wiring layer (not illustrated in the drawing) functioning as the bit line BL. The memory cell transistor MT and the select transistors ST1 and ST2 are formed by the memory pillar MP and the wiring layer 34.

In the example illustrated in FIG. 4, the diameter of the upper face (opening) of the memory pillar MP is larger than the diameter of a lower face brought into contact with the semiconductor substrate 30. The side face of the memory pillar MP has an inclination angle of 90 degrees or less with respect to the plane of the semiconductor substrate 30 (hereinafter, such a shape will be referred to as a "tapered shape"). In such a case, the cell sizes of the memory cell transistors MT (MT0 to MT7) are different for each wiring layer 34 (layer) in accordance with the shape of the memory pillar MP. More specifically, in the example illustrated in FIG. 4, the cell size of the memory cell transistor MT0 is the smallest, and the cell size of the memory cell transistor MT7 is the largest.

When the cell sizes are different, for example, the amounts of changes in threshold voltages of the memory cell transistors MT according to one programming (programming process or instance of programming) may be different. In the example illustrated in FIG. 4, as the memory cell transistor MT is disposed on a further upper layer (higher up, or farther from the substrate 30), the amount of change in the threshold voltage according to one programming becomes larger. In a case where the amount of change in the threshold voltage according to one programming is large, a number of instances of programming implemented to increase the threshold voltage up to at least a target level is small, and accordingly, the period of a write operation is shortened. In other words, the writing speed increases.

Here, the shape of the memory pillar MP is not limited to the tapered shape. For example, the memory pillar MP may have a columnar shape having the same diameter from the upper face to the lower face, or the diameter of the lower face may be larger than the diameter of the upper face.

In the example illustrated in FIG. 4, one wiring layer 34 functioning as the select gate lines SGD and SGS is disposed. Alternatively, a plurality of layers thereof may be disposed.

The source line contact LI has a line shape in the second direction D2. For example, polycrystalline silicon is used for (or, is included in) the source line contact LI. The lower face of the source line contact LI is connected to the n+ type diffusion layer 33, and the upper face thereof is connected to a wiring layer (not illustrated in the drawing) functioning as the source line SL.

1.2 Read Operation

Next, the read operation will be described.

1.2.1 Flow of Read Operation in Memory System

First, the flow of the read operation executed in the memory system 1 will be described with reference to FIG. 5.

Figure 5:
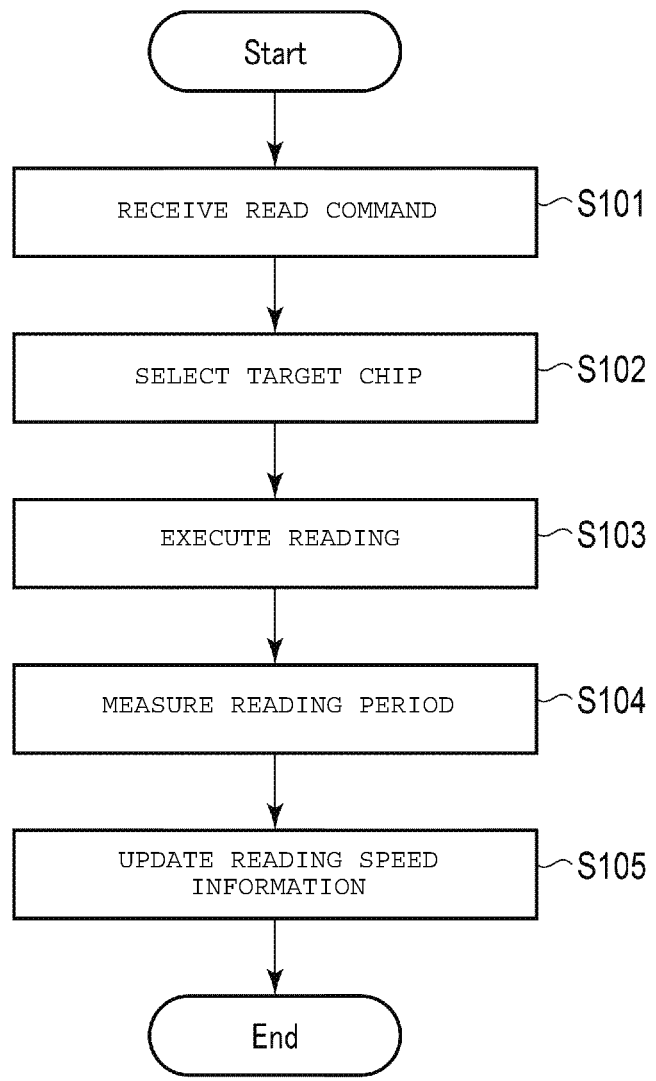
FIG. 5 is a flowchart of a read operation executed in the memory system according to one or more embodiments.

As illustrated in FIG. 5, first, the controller 200 receives a read command from the host apparatus 2 (Step S101).

The controller 200 selects a corresponding NAND chip CP based on a logical address designated in the read command (Step S102). More specifically, the controller 200 reads logical/physical conversion data relating to the target logical address by referring to the lookup table LUT stored in the storage medium 100. Next, the controller 200 converts the target logical address into a physical address. Then, the controller 200 selects a channel CH and a NAND chip CP corresponding to the converted physical address and transmits a read command to the selected NAND chip CP. Hereinafter, the selected NAND chip CP will be referred to as the "selected NAND chip CP".

When the read command is received from the controller 200, the selected NAND chip CP executes a read operation (Step S103). While executing the read operation, the selected NAND chip CP transmits the ready/busy signal R/Bn of the "L" level to the controller 200.

The HW timer 270 of the controller 200 measures, in Step S104, a period in which the ready/busy signal R/Bn is in the "L" level (e.g., reading speed).

The HW timer 270 transmits a result of the measurement of the reading speed to the HW register 280. The HW register 280 updates reading speed information of the corresponding NAND chip CP based on the result of the measurement of the reading speed received from the HW timer 270 (Step S105).

1.2.2 Transmission/Reception of Various Signals in Read Operation

Figure 6:
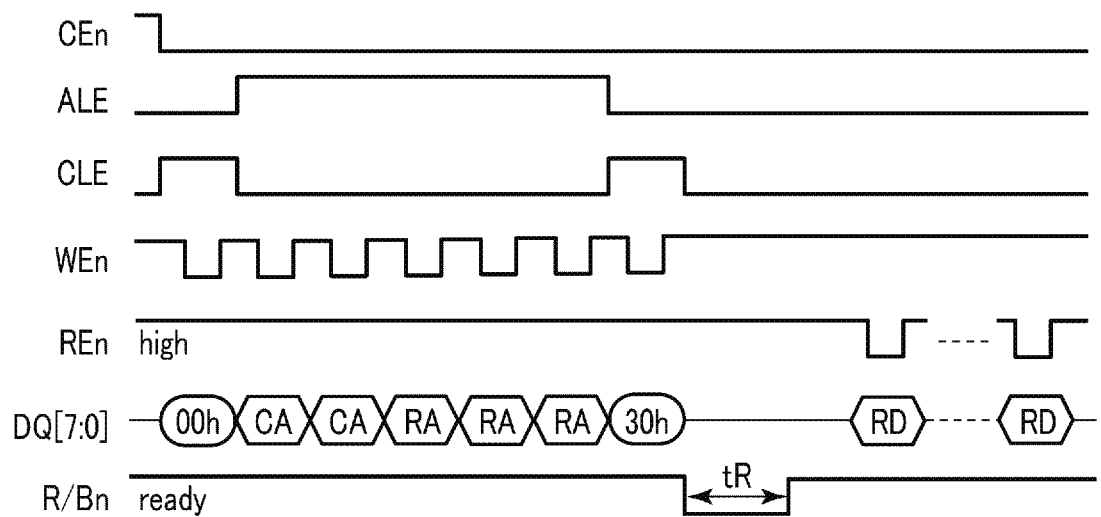
FIG. 6 is a timing chart of various signals transmitted or received (transmitted/received) between a controller and the NAND chip at the time of executing the read operation in the memory system according to one or more embodiments.

Next, transmission/reception of various signals in the read operation will be described with reference to FIG. 6. FIG. 6 is a timing chart of various signals transmitted/received between the controller 200 and the NAND chip CP at the time of executing the read operation. In the example illustrated in FIG. 6, transmission/reception of signals in the read operation after referring to the lookup table LUT are illustrated.

As illustrated in FIG. 6, first, the controller 200 selects a channel CH of the selected NAND chip CP and sets the chip enable signal CEn of the selected NAND chip CP to the "L" level, for assertion. More specifically, for example, in each channel CH, corresponding four NAND chips CP receive chip enable signals CEn from the controller 200 respectively through different signal lines. The controller 200 sets the chip enable signal CEn corresponding to a signal line connected to the selected NAND chip CP to the "L" level, for assertion.

Next, the controller 200 toggles the write enable signal WEn, transmits a command "00h" for a notification of execution of reading to the NAND chip CP, and sets the command latch enable signal CLE to the "H" level, for assertion.

Next, the controller 200 toggles the write enable signal WEn, transmits an address ADD, and sets the address latch enable signal ALE to the "H" level, for assertion. In the example illustrated in FIG. 6, while a case is illustrated in which, after two cycles of the column address CA are transmitted, three cycles of the row address RA are transmitted, the cycles of the column address CA and the row address RA may be freely selected.

Next, the controller 200 toggles the write enable signal WEn, transmits a read command "30h" directing the execution of reading, and sets the command latch enable signal CLE to the "H" level, for assertion.

The NAND chip CP starts reading in accordance with the read command "30h". At this time, the ready/busy signal R/Bn is set to the "L" level (busy state). The sense amplifier 20 disposed in the NAND chip CP reads data from the memory cell array 18 and transfers the read data to the data register 21. Then, when the transfer of the data to the data register 21 ends, the ready/busy signal R/Bn is set to the "H" level (ready state). Hereinafter, in a read operation, a period in which the ready/busy signal R/Bn is in the "L" level will be referred to as a "period tR". In a case where the reading speed information is updated, the HW timer 270 of the controller 200 measures the period tR and transmits a result thereof to the HW register 280. In the HW register 280, the result of the measurement of the period tR is stored for each NAND chip CP as the reading speed information.

In addition, after confirming that the ready/busy signal R/Bn is returned to the "H" level (ready state), the controller 200 sets the read enable signal REn to the "L" level, for assertion. The NAND chip CP transmits the read data RD to the controller 200 based on the read enable signal REn that is toggled. In addition, after the period tR, the controller 200 may set the read enable signal REn to the "L" level for assertion after transmitting a cache read command directing to read data from the data register 21 to the controller 200 to the NAND chip CP.

1.3 Write Operation

Next, the write operation will be described. According to this aspect, three write operations corresponding to three types of data will be described. For the three write operations, the method of selecting the NAND chip CP in the storage medium 100 differs among the write operations, and the write operation itself in the NAND chip CP is the same or similar.

A first write operation is an operation of writing data received from the host apparatus 2. Hereinafter, data received from the host apparatus 2 may be referred to as "user data", and an operation of writing user data may be referred to as "normal writing". In this case, the memory system 1 executes a write operation based on a write command received from the host apparatus 2. The ECC circuit 260 adds ECC data to the user data for each fixed data size (hereinafter, referred to as "each ECC frame size"). Then, in the storage medium 100, the user data and the added ECC data are written. In the normal writing, the controller 200 sequentially selects the NAND chips CP of each channel CH. More specifically, for example, the controller 200 selects the NAND chips in order of the NAND chip CP0 of the channel CH0, the NAND chip CP1 of the channel CH1, the NAND chip CP2 of the channel CH2, the NAND chip CP3 of the channel CH3, the NAND chip CP4 of the channel CH0, . . . , and the NAND chip CP15 of the channel CH3.

A second write operation is an operation of writing updated logical/physical conversion data into the lookup table LUT of the storage medium 100 (hereinafter, referred to as "LUT writing"). The controller 200 updates the logical/physical conversion data in accordance with a normal write operation and temporarily stores the updated logical/physical conversion data in the RAM 220. Then, when the updated logical/physical conversion data in the RAM 220 becomes a fixed data size (for example, a page size), the controller 200 executes an operation of writing to the lookup table LUT. In the LUT writing, data having a relatively high access frequency except for the user data is written. For this reason, the controller 200 selects a NAND chip CP having a high reading speed and/or a high writing speed for each channel CH and executes the writing based on the reading speed information and/or the writing speed information. In addition, the data that is a target for the LUT writing is not limited to the logical/physical conversion data and may be any data having a relatively high access frequency except for the user data.

Figure 7:
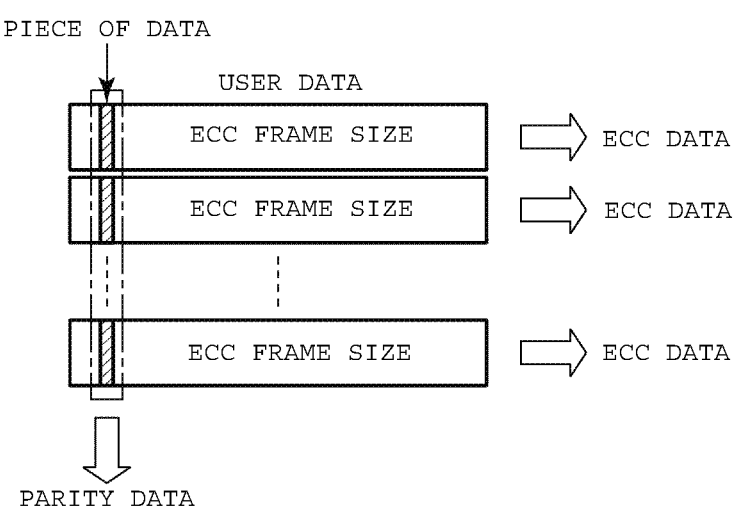
FIG. 7 is a diagram illustrating generation of ECC data and parity data in the memory system according to one or more embodiments.

A third write operation is an operation of writing system data for recovery or parity data (hereinafter, referred to as "parity writing"). The system data for recovery, for example, is data that is stored to prepare for a trouble such as a power cutoff and includes information of the usage status (for example, address ranges to which data has been written) of the storage medium 100. For this reason, the system data for recovery is stored (or, non-volatilized) regularly, or according to a schedule or policy, or in response to a request from the host apparatus 2. The system data for recovery need not be used when there is no trouble such as power cutoff, and thus has a low access frequency. As illustrated in FIG. 7, parity data is generated using one piece of data included in each of a plurality of ECC frame sizes of user data. The parity data is used in a case where an error cannot be corrected using the ECC data added to one ECC frame size in a read operation. For this reason, the parity data has a low access frequency. In the parity writing, data having a relatively low access frequency except for the user data is written. For this reason, the controller 200 executes writing by selecting a chip of which the reading speed and/or the writing speed of each channel CH is slow based on the reading speed information and/or the writing speed information. In addition, data that is a target for the parity writing is not limited to the system data for recovery and the parity data but may be any data having a relatively low access frequency except for the user data.

1.3.1 Flow of Write Operation in Memory System

Next, the flow of the write operation executed in the memory system 1 will be described with reference to FIG. 8. In the example illustrated in FIG. 8, a case is illustrated in which a NAND chip CP is selected by referring to the reading speed information. In this case, update of the writing speed information is omitted.

Figure 8:
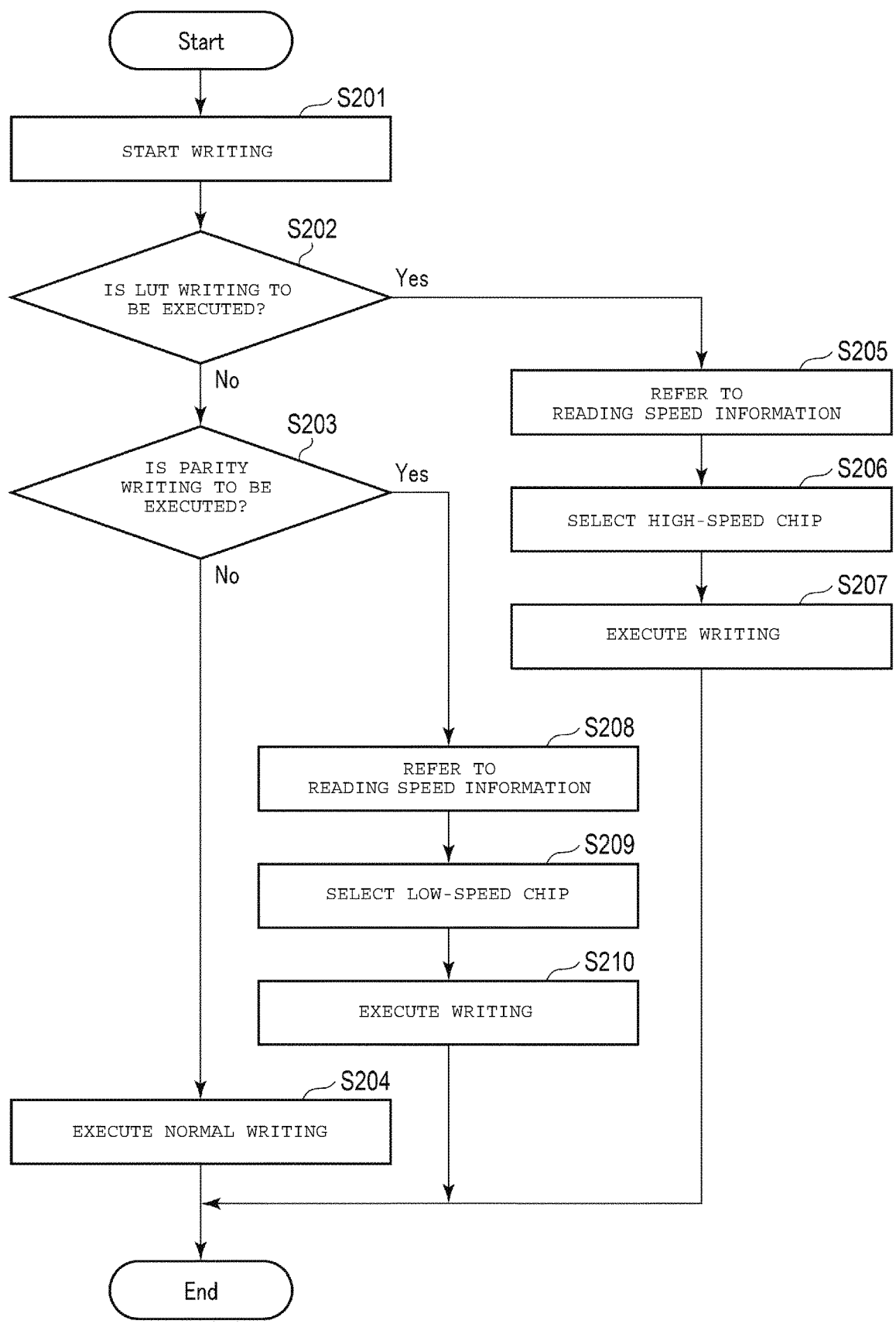
FIG. 8 is a flowchart of a write operation in the memory system according to one or more embodiments.

As illustrated in FIG. 8, the memory system 1, for example, starts a write operation based on a write command from the host apparatus 2 (Step S201). More specifically, in a case where a write command is received from the host apparatus 2, the normal writing is started. In a case where the controller 200 determines that the writing of updated logical/physical conversion data is necessary, the LUT writing is started. Furthermore, in a case where the controller 200 determines that the backup of the system data for recovery is necessary, or when parity data is generated according to the normal writing, the parity writing is started.

In the case of the LUT writing (Yes in Step S202), the controller 200 selects, by referring to the reading speed information (Step S205), a NAND chip CP of which the reading speed is high from each channel CH (Step S206).

The controller 200, for example, transmits a write command to each selected NAND chip CP in order of the channels CH0 to CH3. Then, the selected NAND chip CP executes a write operation based on the write command (Step S207).

In the case of the parity writing (No in Step S202 and Yes in Step S203), the controller 200 selects, by referring to the reading speed information (Step S208), a NAND chip CP of which the reading speed is low from each channel CH (Step S209).

The controller 200, for example, transmits a write command to each selected NAND chip CP in order of the channels CH0 to CH3. Then, the selected NAND chip CP executes a write operation based on the write command (Step S210).

In the case of non-LUT writing and non-parity writing (No in Step S202 and No in Step S203), the normal write operation is executed (Step S204).

1.3.2 Transmission/Reception of Various Signals in Write Operation

Figure 9:
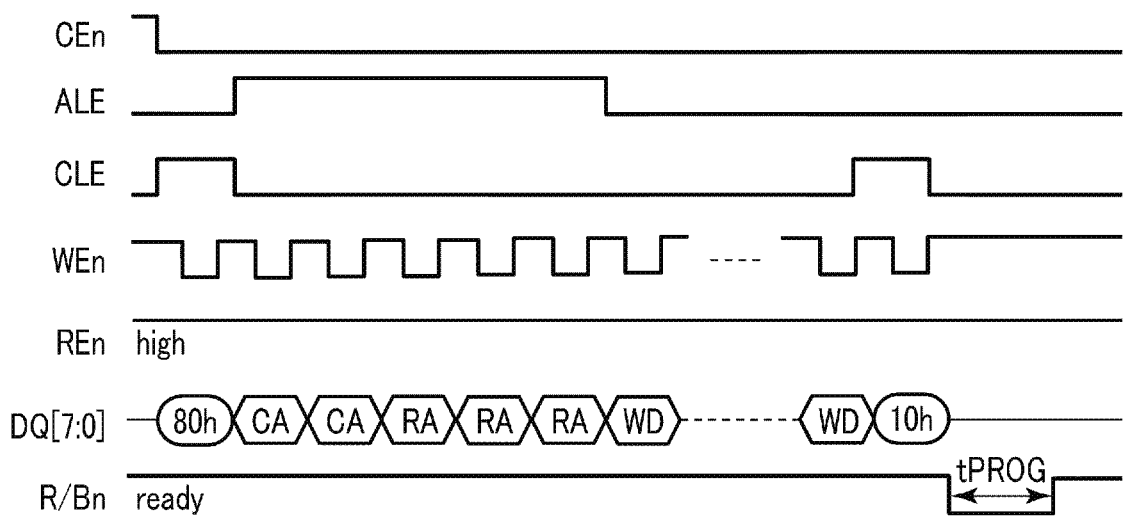
FIG. 9 is a timing chart of various signals transmitted/received between the controller and the NAND chip at the time of executing the write operation in the memory system according to one or more embodiments.

Next, the transmission/reception of various signals in a write operation will be described with reference to FIG. 9. FIG. 9 is a timing chart of various signals transmitted/ received between the controller 200 and the NAND chip CP at the time of executing a write operation.

As illustrated in FIG. 9, first, the controller 200 selects a channel CH of the selected NAND chip CP and sets the chip enable signal CEn of the selected NAND chip CP to the "L" level, for assertion. More specifically, for example, in each channel CH, the corresponding four NAND chips CP receive the chip enable signals CEn from the controller 200 through different signal lines. The controller 200 sets the chip enable signal CEn corresponding to a signal line connected to the selected NAND chip CP to the "L" level, for assertion.

Next, the controller 200 toggles the write enable signal WEn, transmits a command "80h" used for a notification of the execution of a write operation to the storage medium 100 and sets the command latch enable signal CLE to the "H" level, for assertion.

Next, the controller 200 toggles the write enable signal WEn, transmits an address "ADD", and sets the address latch enable signal ALE to the "H" level, for assertion. In the example illustrated in FIG. 9, while a case is illustrated in which, after two cycles of the column address CA are transmitted, three cycles of the row address RA are transmitted, the cycles of the column address and the row address may be freely selected.

Next, the controller 200 toggles the write enable signal WEn and transmits the write data WD for necessary cycles.

In addition, the controller 200 toggles the write enable signal WEn, transmits a write command "10h" directing the execution of writing, and sets the command latch enable signal CLE to the "H" level, for assertion. In response to the write command "10h", the NAND chip CP starts a write operation and is in the busy state (R/Bn="L"). Then, when the writing data for the memory cell array 18 ends, the ready/busy signal R/Bn is set to the "H" level. Hereinafter, in the write operation, a period in which the ready/busy signal R/Bn is in the "L" level will be referred to as a "period tPROG". In a case where the writing speed information is updated, the HW timer 270 of the controller 200 measures the period tPROG and transmits a result of the measurement to the HW register 280. In the HW register 280, the result of the measurement of the period tPROG is stored in each NAND chip CP as the writing speed information.

1.3.3 Write Operation in NAND Chip

Next, a write operation executed in the NAND chip will be described. The write operation executed in the NAND chip CP generally includes programming and verification. The programming is an operation for increasing a threshold voltage of a memory cell transistor MT by injecting electrons into the electric charge accumulating layer (or, an operation for maintaining the threshold voltage by prohibiting the injection). In addition, the verification is an operation of reading data after programming and determining whether or not the threshold voltage of the memory cell transistor MT reaches at least a target level to be achieved. Then, by repeating a combination of programming and verification (hereinafter, referred to as a "program loop"), the threshold voltage of the memory cell transistor MT increases up to at least the target level. Accordingly, when the writing speed increases, the threshold voltage reaches at least the target level in a smaller number of times of looping. For this reason, in a case where the writing speed is high, the period tPROG of the write operation is shortened.

1.4 Specific Example of Selection of NAND Chip in Each Write Operation

Next, a specific example of the selection of a NAND chip in various write operations will be described.

1.4.1 Example of LUT Writing

Figure 10:
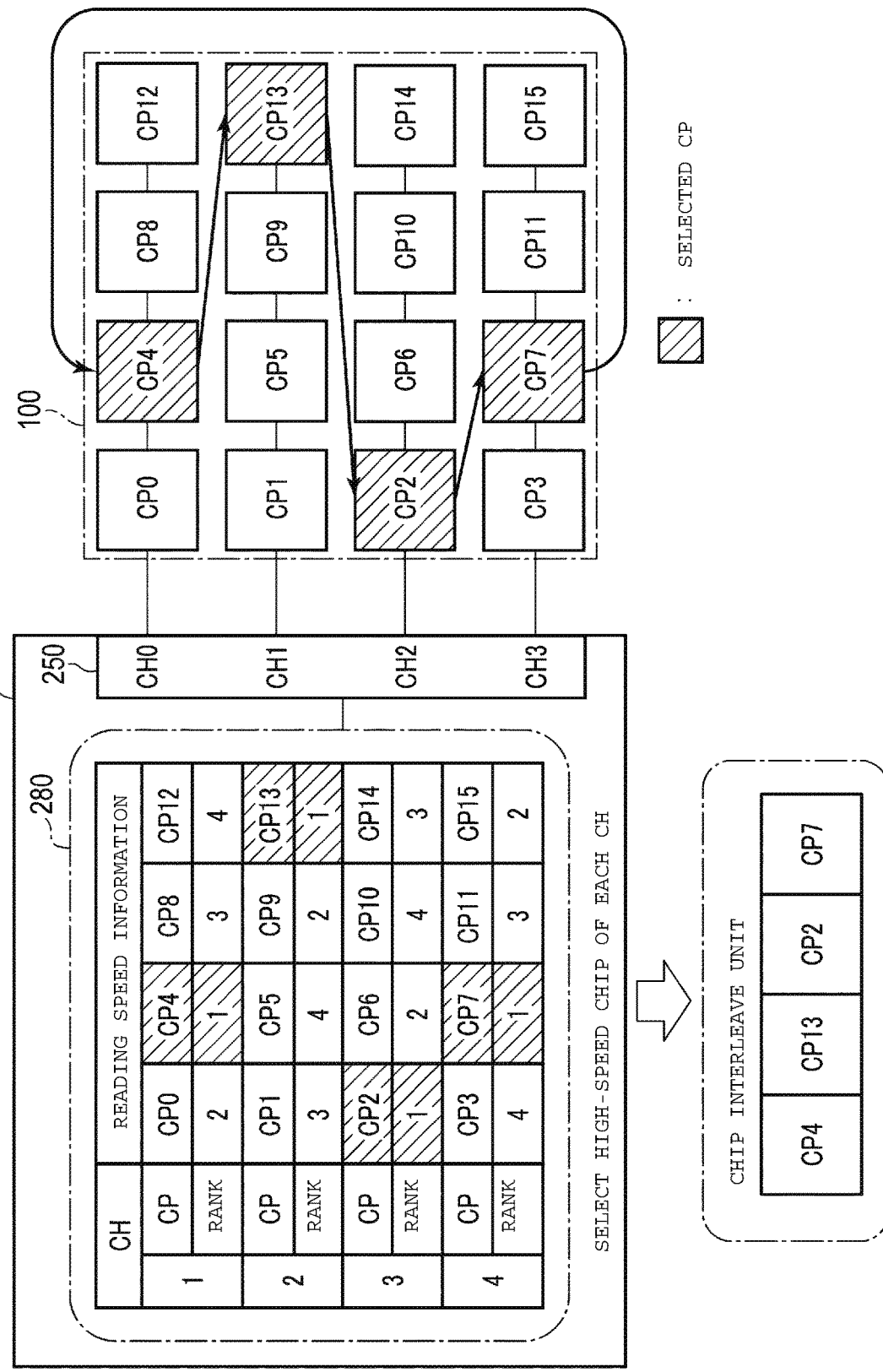
FIG. 10 is a diagram illustrating an example of an assignment of the NAND chip at the time of writing a lookup table (LUT) in the memory system according to the one or more embodiments.

First, an example of selection of NAND chips CP in case of the LUT writing will be described with reference to FIG. 10. The example illustrated in FIG. 10 illustrates a case where NAND chips CP are selected based on the reading speed information. In addition, the example illustrated in FIG. 10 illustrates a case where a rank (reference sign "Rank") of the reading speed of the NAND chip CP for each channel CH is stored in the HW register 280 in correspondence with, or in association with, each NAND chip CP as the reading speed information.

As illustrated in FIG. 10, in the HW register 280 of the controller 200, the reading speed information of each NAND chip CP is stored. In the case of the LUT writing, the processor 230 selects NAND chips CP of which the reading speed in each channel CH is high, for example, of which the rank of the reading speed is "1" or is a highest rank (e.g. for a particular channel) by referring to the reading speed information of the HW register 280. In the example illustrated in FIG. 10, selected NAND chips CP (and corresponding ranks) are identified by hatching of diagonal lines, and the NAND chip CP4 of the channel CH0, the NAND chip CP13 of the channel CH1, the NAND chip CP2 of the channel CH2, and the NAND chip CP7 of the channel CH3 are selected. In the case of the LUT writing, these four NAND chips CP are used without the other NAND chips CP being used. As a result, a loop with the NAND chips CP4, CP13, CP2, and CP7 is the unit of chip interleaving. For example, one block BLK disposed in each of the NAND chips CP4, CP13, CP2, and CP7 is assigned for the LUT writing. The controller 200 stores the logical/physical conversion data, in other words, data of which the access frequency is relatively high except for the user data, in the memory cell array 18 of each NAND chip CP while repeatedly selecting the NAND chips CP4, CP13, CP2, and CP7 in order.

1.4.2 Example of Parity Writing

Next, an example of the selection of NAND chips CP in case of the parity writing will be described with reference to FIG. 11. The example illustrated in FIG. 11, similar to the example illustrated in FIG. 10, illustrates a case where NAND chips CP are selected based on the reading speed information.

Figure 11:
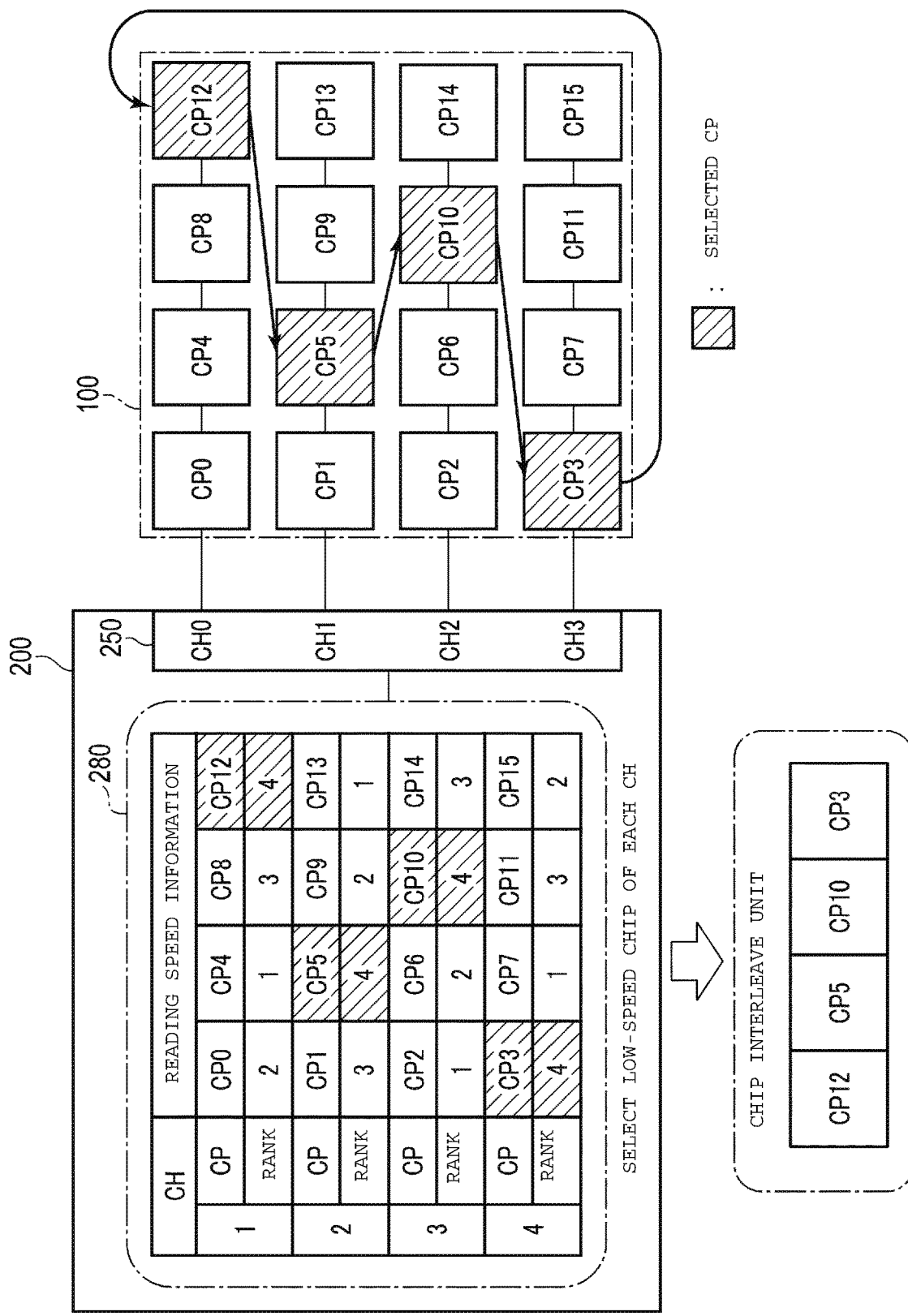
FIG. 11 is a diagram illustrating an example of the assignment of the NAND chip at the time of writing parity in the memory system according to the one or more embodiments.

As illustrated in FIG. 11, in the case of the parity writing, the processor 230 selects NAND chips CP of which the reading speed is low in each channel CH, for example, of which the rank of the reading speed is "4" or is a lowest rank (e.g. for a particular channel) by referring to the reading speed information stored in the HW register 280. In the example illustrated in FIG. 11, selected NAND chips CP (and corresponding ranks) are identified by hatching of diagonal lines, and the NAND chip CP12 of the channel CH0, the NAND chip CP5 of the channel CH1, the NAND chip CP10 of the channel CH2, and the NAND chip CP3 of the channel CH3 are selected. In the case of the parity writing, these four NAND chips CP are used without the other NAND chips CP being used. As a result, a loop with the NAND chips CP12, CP5, CP10, and CP3 is the unit of chip interleaving. For example, one block BLK disposed in each of the NAND chips CP12, CP5, CP10, and CP3 is assigned for the parity writing. The controller 200 stores the system data for recovery or the parity data, in other words, data of which the access frequency is relatively low except for the user data, in the memory cell array 18 of each NAND chip CP while repeatedly selecting the NAND chips CP12, CP5, CP10, and CP3 in order.

1.4.3 Example of Normal Writing

Next, an example of the selection of NAND chips CP in case of the normal writing will be described with reference to FIG. 12.

Figure 12:
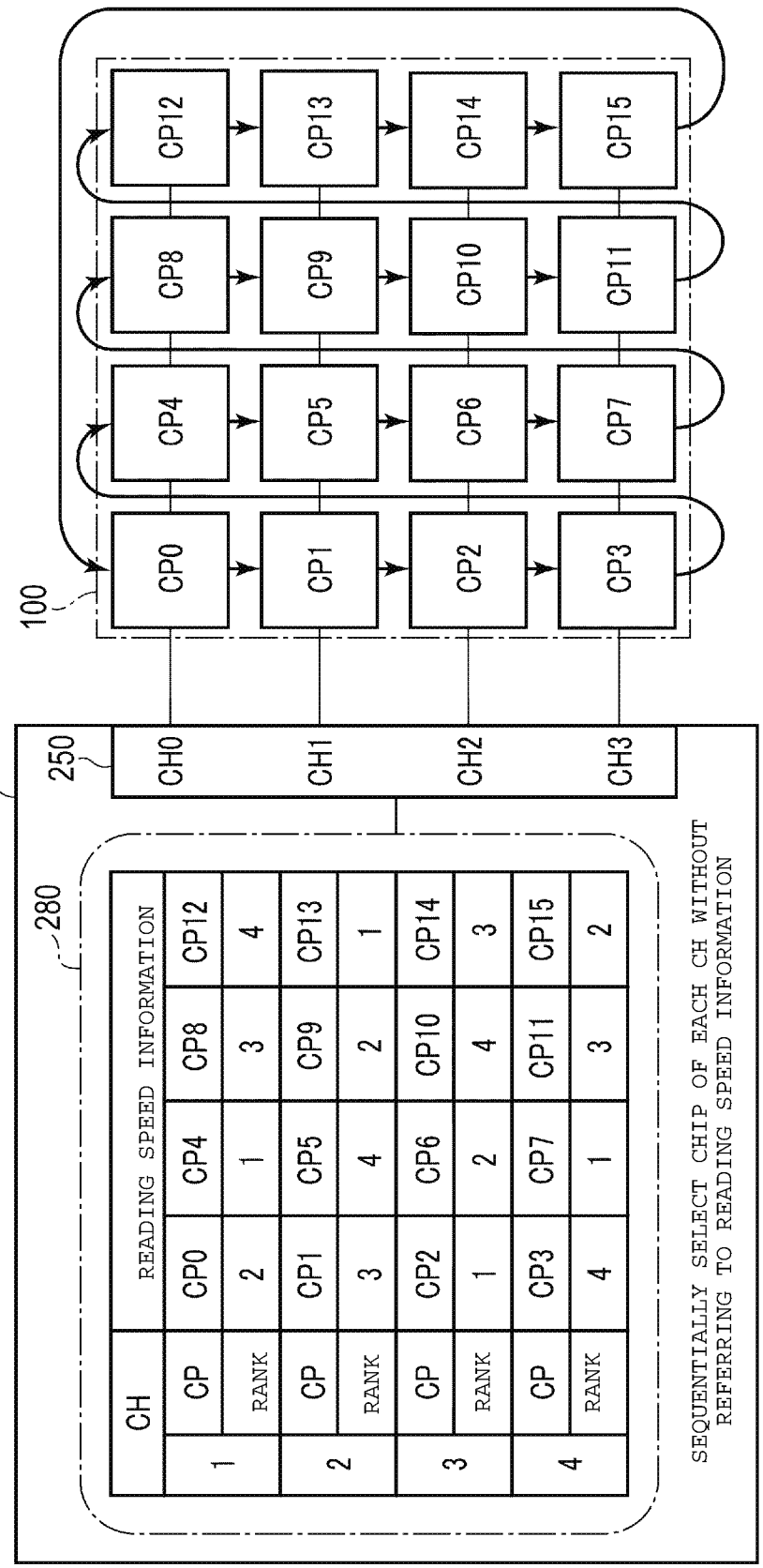
FIG. 12 is a diagram illustrating an example of the assignment of the NAND chip at the time of normal writing in the memory system according to the one or more embodiments.

As illustrated in FIG. 12, in the case of the normal writing, the processor 230 sequentially selects NAND chips CP without referring to the reading speed information stored in the HW register 280. In the example illustrated in FIG. 12, the controller 200 stores user data in the memory cell array 18 of each NAND chip CP while repeatedly selecting NAND chips in order of the NAND chip CP0 of the channel CH0, the NAND chip CP1 of the channel CH1, the NAND chip CP2 of the channel CH2, the NAND chip CP3 of the channel CH3, the NAND chip CP4 of the channel CH0, . . . , the NAND chip CP 15 of the channel CH3.

1.5 Effects According to the First Aspect

According to the configuration of the first aspect, the processing capability of the memory system can be improved. Hereinafter, this effect will be described in detail.

In a memory system including a plurality of NAND chips as storage media, the reading speeds and/or the writing speeds may be different between the NAND chips, for example, due to design such as a layout, a manufacturing process, or non-uniformity caused by deterioration of characteristics according to repetition of writing/erasing.

Thus, the configuration according to the first aspect includes the HW timer 270 measuring a reading speed and the HW register 280 that can hold (or store) the reading speed information of one or more (e.g., each) NAND chip CP. Thus, data having a relatively high access frequency can be written into a NAND chip CP having a relatively high reading speed (e.g. having a high (or highest) reading speed rank), and data having a relatively low access frequency can be written into a NAND chip CP having a relatively low reading speed (e.g. having a low (or lowest) reading speed rank). In this way, the efficiency of the write operation and the read operation can be enhanced. Accordingly, the processing capability of the memory system can be improved.

2. SECOND ASPECT

Next, one or more embodiments according to a second aspect will be described. According to the second aspect, a case in which the writing speed is measured will be described. Hereinafter, only points different from those of the first aspect will be described.

2.1 Flow of Write Operation in Memory System

The flow of a write operation executed in the memory system 1 will be described with reference to FIG. 13.

Figure 13:
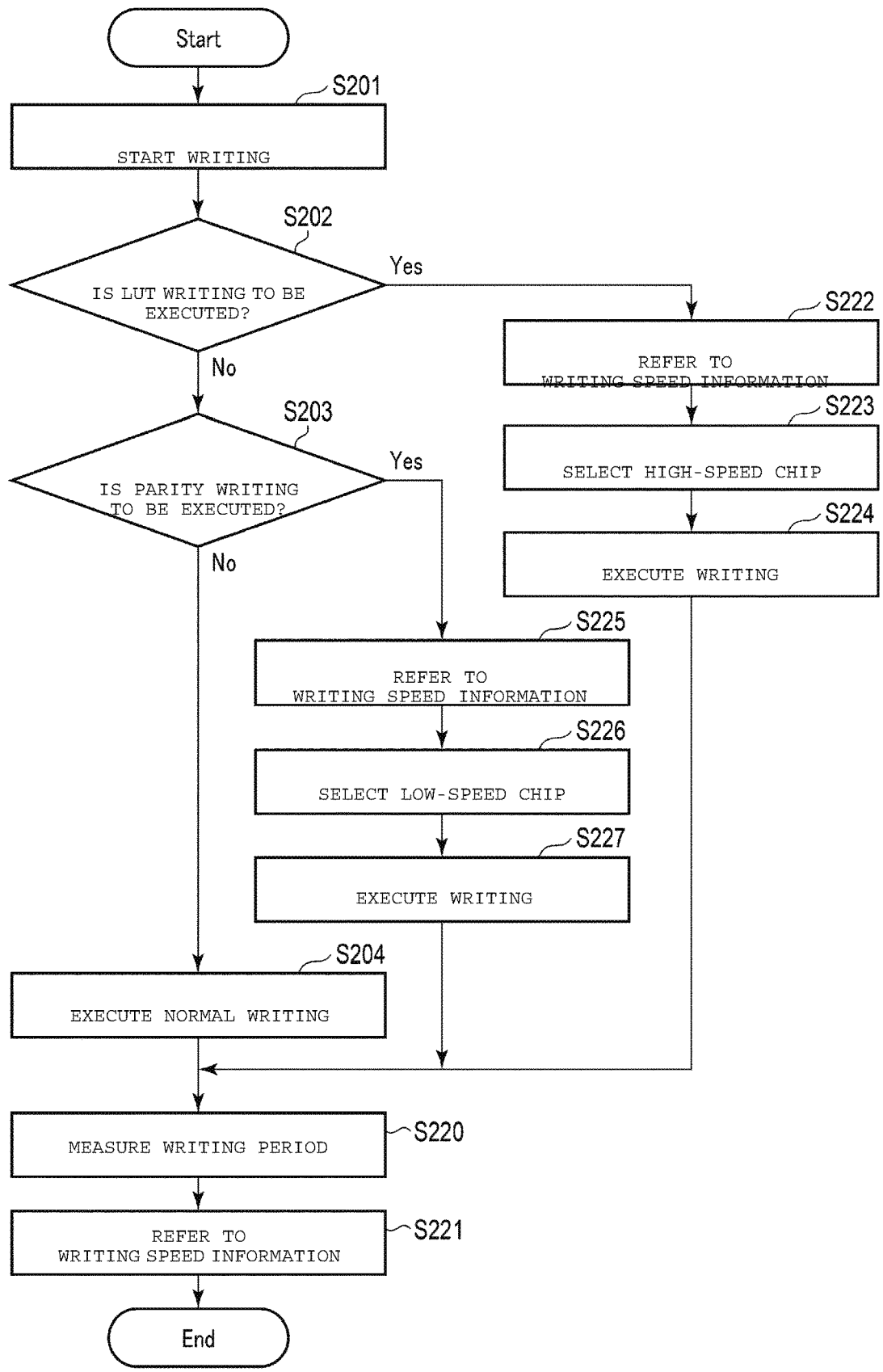
FIG. 13 is a flowchart of a write operation executed in a memory system according to one or more embodiments.

As illustrated in FIG. 13, in the case of the LUT writing (Yes in Step S202), the controller 200 selects, by referring to writing speed information (Step S222), a NAND chip CP having a high writing speed in each channel CH (Step S223). Then, the selected NAND chip CP executes a write operation based on a write command (Step S224).

In the case of the parity writing (No in Step S202 and Yes in Step S203), the controller 200 selects, by referring to the writing speed information (Step S225), a NAND chip CP having a low writing speed in each channel CH (Step S226). Then, the selected NAND chip CP executes a write operation based on a write command (Step S227).

In the case of non-LUT writing and non-parity writing (No in Step S202 and No in Step S203), a normal write operation is executed (Step S204).

While the selected NAND chip CP executes the write operation (Step S204, S224, or S227), the HW timer 270 measures a period tPROG (writing speed) of the write operation (Step S220).

The HW register 280 updates the writing speed information of the corresponding NAND chip CP based on the result of the measurement of the writing speed received from the HW timer 270 (Step S221).

In the LUT writing, not only the logical/physical conversion data but also data for which the writing performance can be improved by writing the data into a fast NAND chip CP (e.g. due to a high writing frequency or the like) may be written. Furthermore, in the parity writing, not only the system data for recovery or the parity data but data for which the writing performance is not significantly improved even by writing the data into a fast NAND chip CP (e.g. due to a low writing frequency or the like) may be written.

2.2 Effects According to the Second Aspect

According to the second aspect, effects similar to those of the first aspect can be obtained. More specifically, the HW timer 270 measuring a writing speed and the HW register 280 that can hold the writing speed information of each NAND chip CP are provided. Then, data having a relatively high access frequency or data for which the writing performance can be improved by writing the data into a fast NAND chip CP (e.g. due to a high writing frequency or the like) can be written into a NAND chip CP having a relatively high writing speed, and data having a relatively low access frequency or data for which the writing performance is not significantly improved even by writing the data into a fast NAND chip CP (e.g. due to a low writing frequency or the like) can be written into a NAND chip CP having a relatively low writing speed. In this way, the efficiency of the write operation and the read operation can be enhanced. Accordingly, the processing capability of the memory system can be improved.

3. THIRD ASPECT

Next, one or more embodiments according to a third aspect will be described. According to the third aspect, a case will be described in which reading speed information and/or writing speed information measured at the time of manufacturing is stored in the HW register 280. According to this aspect, the HW timer 270 used for measuring the reading speed and/or the writing speed is removed. Hereinafter, only points that are different from those of the first and second aspects will be described.

3.1 Flow of Read Operation in Memory System

The flow of a read operation executed in a memory system 1 will be described with reference to FIG. 14.

Figure 14:
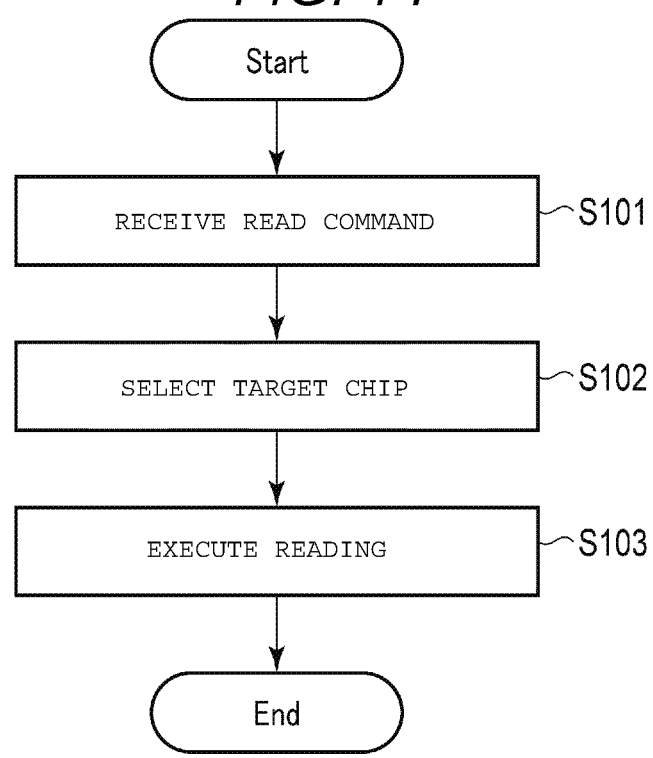
FIG. 14 is a flowchart of a read operation executed in a memory system according to one or more embodiments.

As illustrated in FIG. 14, a difference from one or more embodiments according to the first aspect illustrated in FIG. 5 is in that Steps S104 and S105 used for updating the reading speed information are removed.

3.2 Flow of Write Operation in Memory System

Next, the flow of the write operation executed in the memory system 1 will be described with reference to FIG. 15. While the example illustrated in FIG. 15 illustrates a case where a NAND chip CP is selected based on reading speed information, the NAND chip CP may be selected based on the writing speed information or both the reading speed information and the writing speed information.

Figure 15:
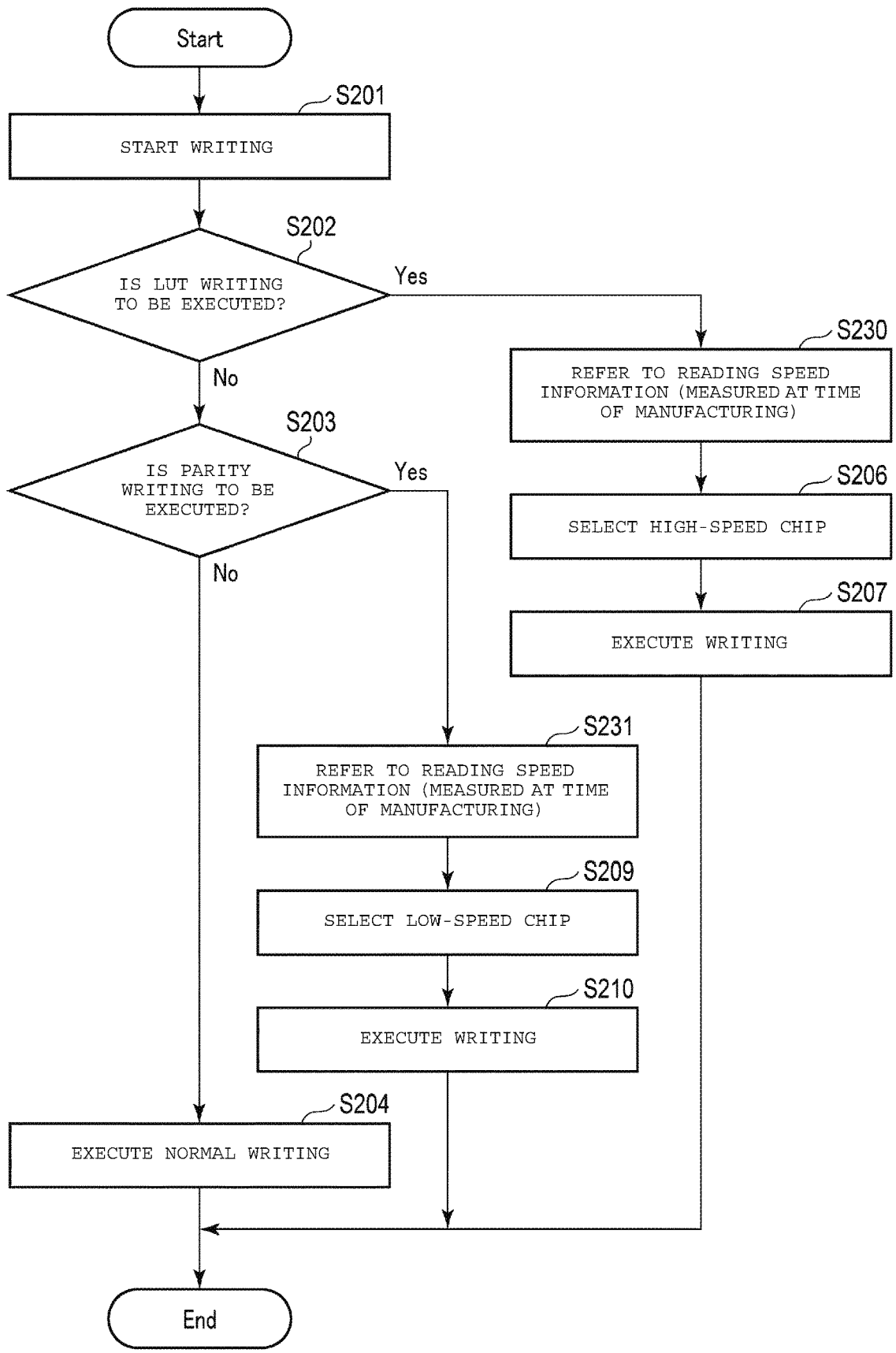
FIG. 15 is a flowchart of a write operation executed in the memory system according to one or more embodiments.

As illustrated in FIG. 15, in the case of the LUT writing (Yes in Step S202), the controller 200 selects, by referring to the reading speed information measured at the time of manufacturing (Step S230), a NAND chip CP having a high reading speed in each channel CH (Step S206). Then, the selected NAND chip CP executes a write operation based on a write command (Step S207).

In the case of the parity writing (No in Step S202 and Yes in Step S203), the controller 200 selects, by referring to the reading speed information measured at the time of manufacturing (Step S231), a NAND chip CP having a low reading speed in each channel CH (Step S209). Then, the selected NAND chip CP executes a write operation based on a write command (Step S210).

A normal write operation of Step S204 is the same as or similar to that according to the first aspect.

In this aspect, while a case is described in which the reading speed information stored in the HW register 280 is referred to, the HW register 280 may be omitted. For example, instead of storing the reading speed information in the HW register 280, a circuit protection device (e.g. an EFUSE device) mounted in the controller 200 may have a cutoff set based on the reading speed information at the time of shipment, and the NAND chips CP may be selected based on the EFUSE cutoff.

3.3 Effects According to This Aspect

According to the configuration of this aspect, effects similar to those of the first and second aspects can be obtained.

4. FOURTH ASPECT

Next, one or more embodiments according to a fourth aspect will be described. According to the fourth aspect, a case is illustrated in which reading speed information and/or writing speed information are stored in the HW register 280 for one or more blocks BLK of one or more NAND chips CP (e.g. a ranking of each block BLK of each NAND chip CP is stored in the HW register 280), and a NAND chip CP including a block BLK having a high reading speed and/or a writing speed is selected. Hereinafter, only points different from those of the first to third aspects will be described.

4.1 Flow of Write Operation in Memory System

The flow of the write operation executed in the memory system 1 will be described with reference to FIG. 16. The example illustrated in FIG. 16 illustrates a case where a block BLK is selected based on the reading speed information.

Figure 16:
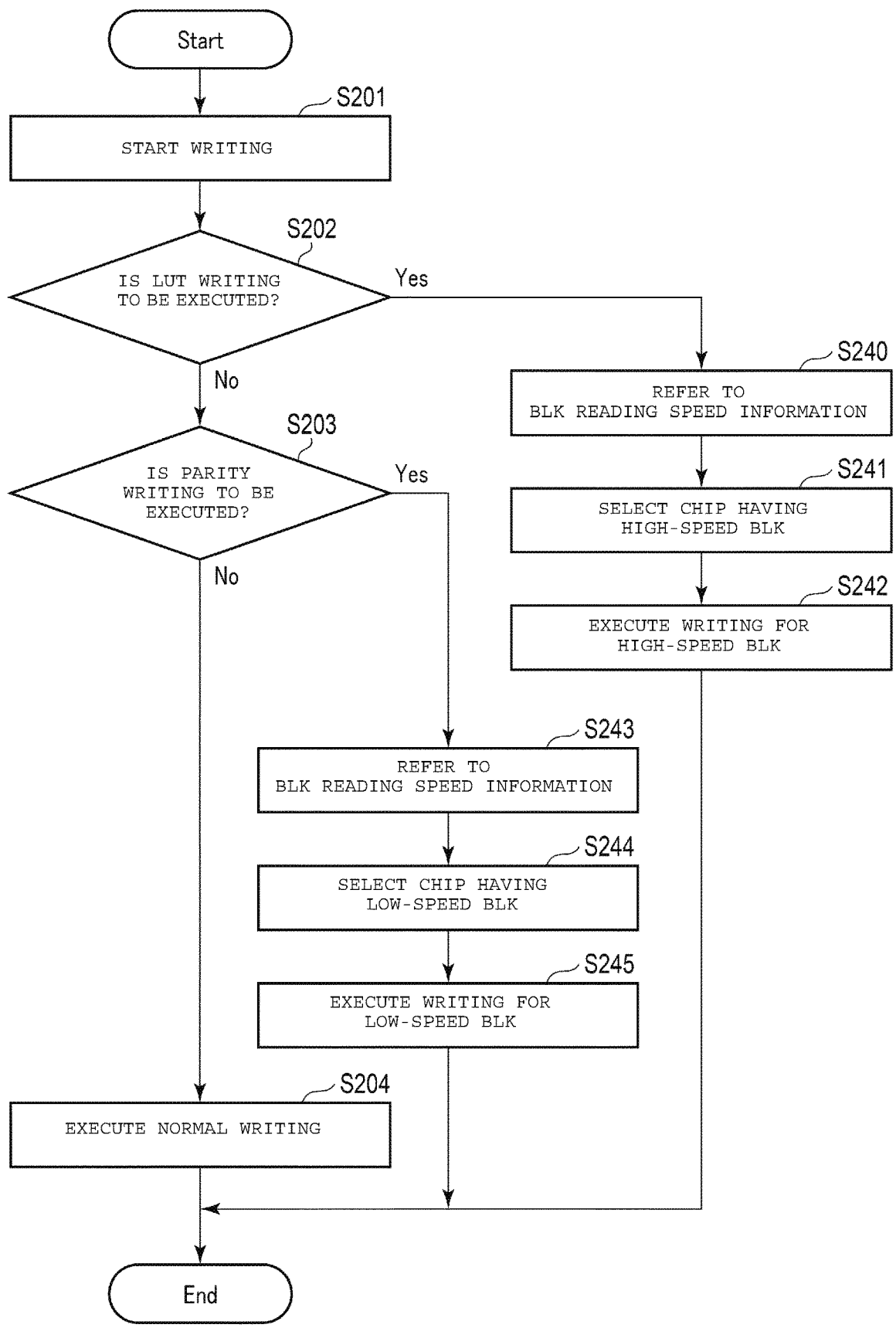
FIG. 16 is a flowchart of a write operation executed in a memory system according to one or more embodiments.

As illustrated in FIG. 16, in the case of the LUT writing (Yes in Step S202), the controller 200 selects, by referring to the reading speed information of each block BLK (Step S240), a NAND chip CP including a block BLK of which the reading speed in each channel CH is high (Step S241). Then, the selected NAND chip CP executes a write operation for the block BLK having the high reading speed based on a write command (Step S242).

In the case of the parity writing (No in Step S202 and Yes in Step S203), the controller 200 selects, by referring to the reading speed information of each block BLK (Step S243), a NAND chip CP including a block BLK having a low reading speed in each channel CH (Step S244). Then, the selected NAND chip CP executes a write operation for the block BLK having the low reading speed based on a write command (Step S245).

A normal write operation of Step S204 is the same as or similar to that according to the first and third aspects.

4.2 Effects According to This Aspect

According to the configuration of this aspect, effects similar to those of the first to third embodiments can be obtained.

5. FIFTH ASPECT

Next, one or more embodiments according to a fifth aspect will be described. According to the fifth aspect, a case is illustrated in which reading speed information and/or writing speed information are stored in the HW register 280 for one or more word lines WL of one or more blocks BLK of one or more NAND chips CP (e.g. a ranking of each word line WL of each block BLK of each NAND chip CP is stored in the HW register 280), and a NAND chip CP including a word line WL to which a memory cell transistor MT having a high writing speed and/or a high reading speed is connected is selected. Hereinafter, only points different from those of the first to fourth aspects will be described.

5.1 Flow of Write Operation in Memory System

The flow of the write operation executed in the memory system 1 will be described with reference to FIG. 17. The example illustrated in FIG. 17 illustrates a case in which a word line WL is selected based on the reading speed information.

Figure 17:
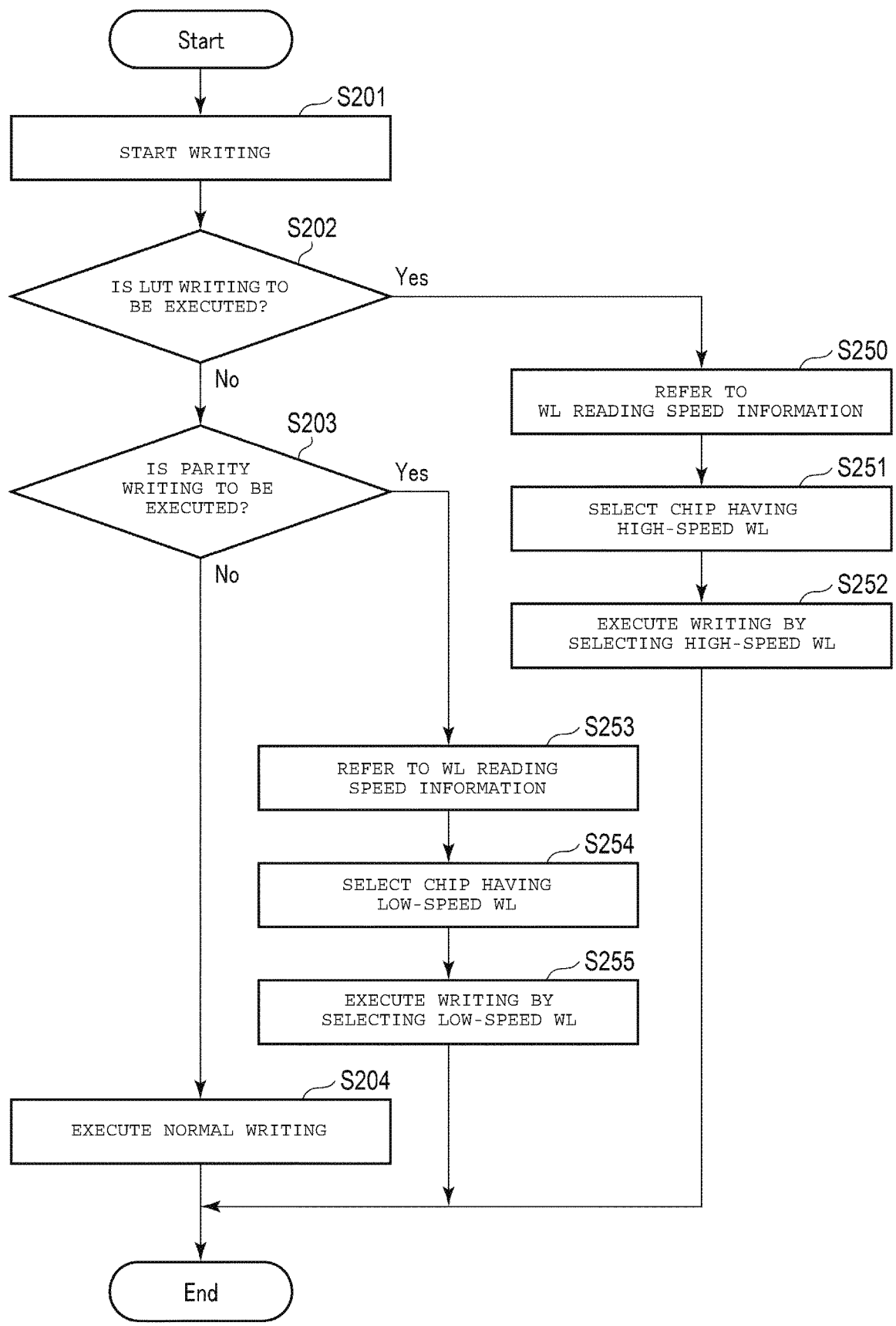
FIG. 17 is a flowchart of a write operation executed in a memory system according to one or more embodiments.

As illustrated in FIG. 17, in the case of the LUT writing (Yes in Step S202), the controller 200 selects, by referring to the reading speed information of each word line WL (Step S250), a NAND chip CP including a word line WL (connected to a memory cell transistor MT) having a high reading speed in each channel CH (Step S251). Then, the selected NAND chip CP executes a write operation for a memory cell group MCG corresponding to the word line WL having the high reading speed based on a write command (Step S252). More specifically, for example, in a case where the word line WL7 of the block BLK0 is selected in the memory cell array 18 according to the first aspect described with reference to FIGS. 3 and 4, the memory cell group MCG of the string units SU0 to SU3 to which the word line WL7 is connected is a writing target.

In the case of the parity writing (No in Step S202 and Yes in Step S203), the controller 200 selects, by referring to the reading speed information of each word line WL (Step S253), a NAND chip CP including a word line WL having a low reading speed in each channel CH (Step S254). Then, the selected NAND chip CP executes a write operation for a memory cell group MCG corresponding to the word line WL having a low reading speed based on a write command (Step S255). More specifically, for example, in a case where the word line WL0 of the block BLK0 is selected, the memory cell group MCG of string units SU0 to SU4 to which the word line WL0 is connected is a writing target.

A normal write operation of Step S204 is the same as or similar to that according to the first to fourth aspects.

5.2 Effects According to This Aspect

According to the configuration of this aspect, effects similar to those of the first to fourth aspects can be obtained.

6. SIXTH ASPECT

Next, one or more embodiments according to a sixth aspect will be described. In the sixth aspect, a case will be described in which design information of NAND chips CP (hereinafter, referred to as "NAND design information") is stored in the HW register 280. The NAND design information, for example, is information predicting or estimating the reading speed and/or the writing speed of one or more NAND chips CP based on the layout of wirings connecting the controller 200 and NAND chips CP, the layout of wirings connecting the memory cell arrays 18 disposed in the NAND chip CP and the peripheral circuits (the sense amplifier 20, the row decoder 19, and the like), and design information of a three-dimensional structure of the memory cell transistors MT and the like. The NAND design information may include a ranking of the NAND chips CP. In this aspect, similar to the third aspect, the HW timer 270 used for measuring a writing speed and/or a reading speed can be omitted. Hereinafter, only points different from those according to the first to fifth aspects will be described.

In this aspect, a case is described in which the NAND design information stored in the HW register 280 is referred to. The HW register 280 may be omitted. Then, instead of storing the NAND design information in the HW register 280, an EFUSE device mounted in the controller 200 based on the NAND design information may have a cutoff set at the time of shipment, and NAND chips CP may be selected based on the EFUSE cutoff.

6.1 Flow of Write Operation in Memory System

The flow of the write operation executed in the memory system 1 will be described with reference to FIG. 18.

Figure 18:
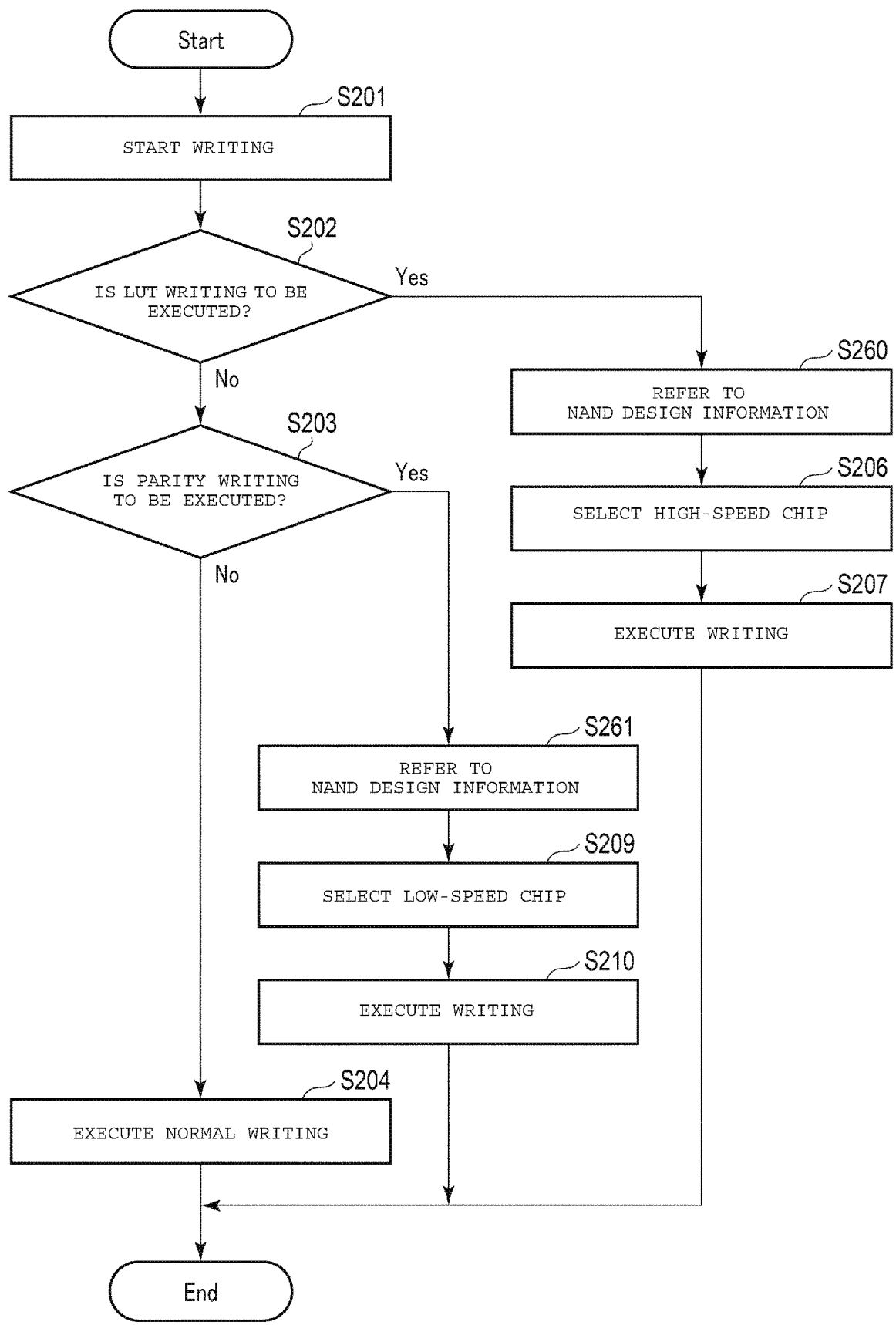
FIG. 18 is a flowchart of a write operation executed in a memory system according to one or more embodiments.

As illustrated in FIG. 18, in the case of the LUT writing (Yes in Step S202), the controller 200 selects, by referring to the NAND design information (Step S260), a NAND chip CP having a high reading speed in each channel CH (Step S206). Then, the selected NAND chip CP executes a write operation based on a write command (Step S207).

In the case of the parity writing (No in Step S202 and Yes in Step S203), the controller 200 selects, by referring to the NAND design information (Step S261), a NAND chip CP having a low reading speed in each channel CH (Step S209). Then, the selected NAND chip CP executes a write operation based on the write command (Step S210).

A normal write operation of Step S204 is the same as or similar to that according to the first to fifth aspects.

6.2 Effects According to This Aspect

According to the configuration of this aspect, effects similar to those of the first to fifth aspects can be obtained.

7. SEVENTH ASPECT

Next, one or more embodiments according to a seventh aspect will be described. In the seventh aspect, a case will be described in which information of the bit error rate BER (hereinafter, referred to as "BER information") is stored in the HW register 280. For example, in the case of a NAND chip CP having a high bit error rate BER, an ECC processing period of the ECC circuit 260 increases, and thus the processing period of the read operation including the ECC processing increases regardless of the reading speed of the NAND chip CP. In this aspect, similar to the third aspect, the HW timer 270 used for measuring a writing speed and/or the reading speed can be omitted. Hereinafter, only points different from the first to sixth aspects will be described.

7.1 Flow of Read Operation in Memory System

First, the flow of a read operation executed in a memory system 1 will be described with reference to FIG. 19.

Figure 19:
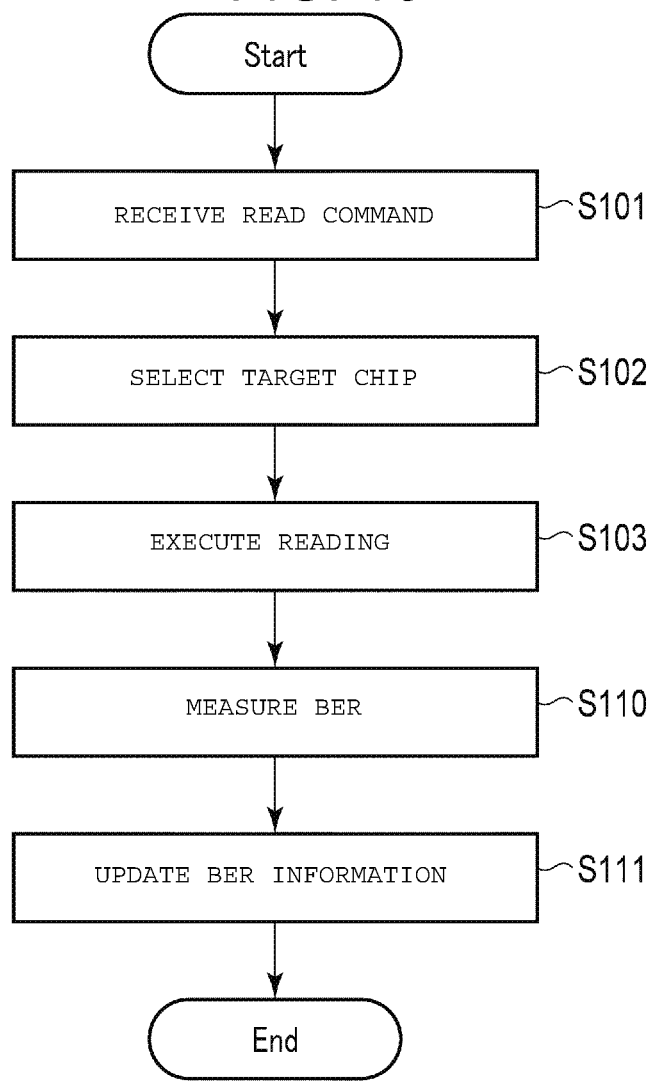
FIG. 19 is a flowchart of a read operation executed in a memory system according to one or more embodiments.

As illustrated in FIG. 19, the operations of Step S101 to S103 are the same as or similar to those according to the first aspect illustrated in FIG. 5.

When a read data RD is received from the selected NAND chip CP, the controller 200, after storing the read data RD in the buffer memory 240 once, executes an ECC process for the read data RD using the ECC circuit 260. At this time, the ECC circuit 260 measures the bit error rate BER by counting the number of error bits and transmits the result of the measurement to the HW register 280 (Step S110).

When the BER information is received from the ECC circuit 260, the HW register 280 updates the BER information of the corresponding NAND chip CP (Step S111).

7.2 Flow of Write Operation in Memory System

The flow of a write operation executed in the memory system 1 will be described with reference to FIG. 20.

Figure 20:
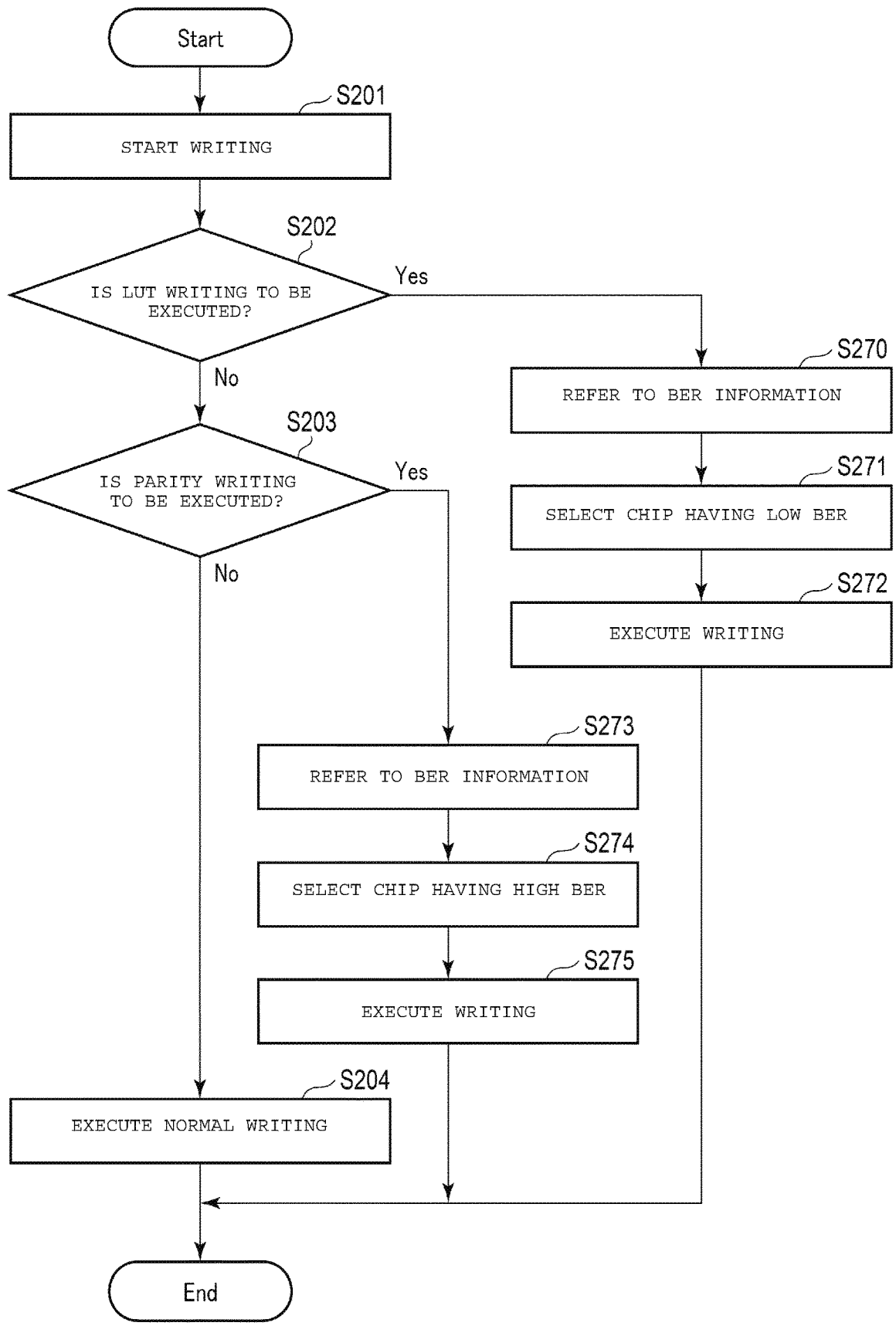
FIG. 20 is a flowchart of a write operation executed in the memory system according to one or more embodiments.

As illustrated in FIG. 20, in the case of the LUT writing (Yes in Step S202), the controller 200 selects, by referring to the BER design information (Step S270), a NAND chip CP having a low bit error rate BER in each channel CH (Step S271). Then, the selected NAND chip CP executes a write operation based on a write command (Step S272).

In the case of the parity writing (No in Step S202 and Yes in Step S203), the controller 200 selects, by referring to the BER design information (Step S273), a NAND chip CP having a high bit error rate BER in each channel CH (Step S274). Then, the selected NAND chip CP executes a write operation based on a write command (Step S275).

A normal write operation of Step S204 is similar to that according to the first to sixth aspects.

7.3 Effects According to This Aspect

According to the configuration of this aspect, effects similar to those of the first to sixth aspects can be obtained.

8. MODIFIED EXAMPLES

The memory system according to one or more modified examples includes: a plurality of first memory chips (CP) connected to the first bus (NBUS0); a plurality of second memory chips (CP) connected to the second bus (NBUS1); and a controller (200) that are connected to the first and second buses and is configured to perform a write operation by performing processes including: selecting one or more first memory chips of the plurality of first memory chips based on first information including bit error rate information for the plurality of first memory chips, and selecting one or more second memory chips of the plurality of second memory chips based on second information including bit error rate information for the plurality of second memory chips.

By employing the modified examples described above, a semiconductor memory device capable of improving the processing capability can be provided.

The modified examples are not limited to the examples described above, and various changes can be made therein.

For example, the modified examples described above can be combined together as appropriate. For example, according to the third aspect and/or the fourth aspect, a block BLK may be selected based on the writing speed information.

In the first to sixth aspects described above, NAND chips CP may be selected using both the reading speed information and the writing speed information.

Furthermore, the modified examples described above can be applied not only to a NAND chip using a three-dimensionally stacked NAND flash memory but also to a NAND chip using a planar NAND flash memory in which memory cells are arranged on a semiconductor substrate. In addition, the modified examples described above are not limited to being applied to a NAND flash memory but can be applied to a chip using other non-volatile memories.

Furthermore, some aspects can be combined by selecting one or more NAND chips CP based on multiple rankings. For example, one or more NAND chips CP can be selected by a function of the multiple rankings. For example, an aggregated ranking (e.g. an average ranking, or a weighted average ranking) may be calculated based on the one or more rankings, and a NAND chip CP may be selected based on the average ranking in accordance with any of the aspects described herein.

Furthermore, the term "connection" as used herein refers to configurations that include a state of being indirectly connected through a certain object such as a transistor or a resistor.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system comprising:
a plurality of memory chips connected to a bus; and
a controller connected to the bus and configured to:
in a first write operation, select a first memory chip from a plurality of memory chips on the basis of first information indicating data reading speeds of the plurality of memory chips;
write first data to the selected first memory chip, the first data being data that converts a logical address received from an external device into at least one physical address assigned to the plurality of memory chips;
in a second write operation, select a second memory chip from the plurality of memory chips on the basis of the first information;
write second data to the selected second memory chip, the second data being data that carries out an error correction process over a plurality of pieces of data read from the plurality of memory chips, respectively,
wherein the first memory chip has a higher data reading speed than the second memory chip.

2. The memory system of claim 1, wherein the controller further includes a measurement circuit configured to measure the data reading speeds.

3. The memory system of claim 2, wherein the measurement circuit is configured to measure a period in which a ready/busy signal received from each of the plurality of memory chips is in a busy state.

4. The memory system of claim 1, wherein the first information includes a ranking of data reading speeds for the plurality of memory chips.

5. The memory system of claim 1, wherein the first information includes a ranking of data reading speeds for a plurality of data blocks for one or more of the plurality of memory chips.

6. The memory system of claim 1, wherein the first information includes a ranking of data reading speeds for a plurality of word lines for the plurality of memory chips.

7. The memory system of claim 1, wherein the data reading speed information of the plurality of memory chips is measured at a time of manufacturing the memory system.

8. The memory system of claim 1, wherein the data reading speed information of the plurality of memory chips is determined on the basis of design information of the plurality of memory chips.

9. A memory system comprising:
a plurality of memory chips connected to a bus; and
a controller connected to the bus and is configured to:
in a first write operation, select a first memory chip from a plurality of memory chips on the basis of first information including bit error rate information of the plurality of memory chips;
write first data to the selected first memory chip, the first data being data that converts a logical address received from an external device into at least one physical address assigned to the plurality of memory chips;
in a second write operation, select a second memory chip from the plurality of memory chips on the basis of the first information; and
write second data to the selected second memory chip, the second data being data that carries out an error correction process over a plurality of pieces of data read from the plurality of memory chips, respectively,
wherein the first memory chip has a lower bit error rate than the second memory chip.

10. The memory system of claim 9,
wherein the controller is further configured to measure the at least one bit error rate by executing an error correction process of data read from the plurality of memory chips.

11. A memory system comprising:
a plurality of memory chips connected to a bus; and
a controller connected to the bus and configured to:
in a first write operation, select a first memory chip from a plurality of memory chips on the basis of first information including data writing speed information indicating writing speeds of the plurality of memory chips;
write first data to the selected first memory chip, the first data being data that converts a logical address received from an external device into at least one physical address assigned to the plurality of memory chips;
in a second write operation, select a second memory chip from the plurality of memory chips on the basis of the first information; and
write second data to the selected second memory chip, the second data being data that carries out an error correction process over a plurality of pieces of data read from the plurality of memory chips, respectively,
wherein the first memory chip has a higher data writing speed than the second memory chip.

12. The memory system of claim 11, wherein the controller further includes a measurement circuit configured to measure the data writing speeds.

13. The memory system of claim 12, wherein the measurement circuit is configured to measure a period in which a ready/busy signal received from each of the plurality of memory chips is in a busy state.

14. The memory system of claim 11, wherein the first information includes a ranking of data writing speeds of the plurality of memory chips.

15. The memory system of claim 11, wherein the first information includes a ranking of data writing speeds of a plurality of data blocks of one or more of the plurality of memory chips.

16. The memory system of claim 11, wherein the first information includes a ranking of data writing speeds of a plurality of word lines of the plurality of memory chips.

17. The memory system of claim 11, wherein the data writing speed information of the plurality of memory chips is measured at a time of manufacturing the memory system.

18. The memory system of claim 11, wherein the data writing speed information of the plurality of memory chips is determined on the basis of design information of the plurality of memory chips.

* * * * *